(12) United States Patent
Binnard et al.

(10) Patent No.: US 10,747,117 B2
(45) Date of Patent: *Aug. 18, 2020

(54) EXTREME ULTRAVIOLET LITHOGRAPHY SYSTEM THAT UTILIZES PATTERN STITCHING

(71) Applicant: NIKON CORPORATION, Tokyo (JP)

(72) Inventors: Michael B. Binnard, Belmont, CA (US); Daniel Gene Smith, Tucson, AZ (US); David M. Williamson, Tucson, AZ (US)

(73) Assignee: NIKON CORPORATION (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/379,010

(22) Filed: Apr. 9, 2019

(65) Prior Publication Data

US 2019/0235393 A1 Aug. 1, 2019

Related U.S. Application Data

(63) Continuation of application No. 15/629,353, filed on Jun. 21, 2017, now Pat. No. 10,295,911, which is a continuation-in-part of application No. PCT/US2017/037786, filed on Jun. 15, 2017, which is a continuation-in-part of application No. 15/599,148, filed on May 18, 2017, which is a
(Continued)

(51) Int. Cl.
*G03F 7/20* (2006.01)

(52) U.S. Cl.
CPC ...... *G03F 7/70191* (2013.01); *G03F 7/70033* (2013.01); *G03F 7/70066* (2013.01); *G03F 7/70475* (2013.01)

(58) Field of Classification Search
CPC .................. G03F 7/70033; G03F 7/70191
See application file for complete search history.

(56) References Cited

U.S. PATENT DOCUMENTS

| 3,884,573 A | 5/1975 | Franklin |
| 4,924,257 A | 5/1990 | Jain |

(Continued)

FOREIGN PATENT DOCUMENTS

| WO | WO2009083229 A1 | 7/2009 |
| WO | 2012177663 A3 | 12/2012 |

OTHER PUBLICATIONS

H.H. Solak, "Sub-50mm period patterns with EUV interference lithography", Microselectronic Enginnering 67-68, (2003).
(Continued)

*Primary Examiner* — Deoram Persaud
(74) *Attorney, Agent, or Firm* — Roeder & Broder LLP; Steven G. Roeder

(57) ABSTRACT

An extreme ultraviolet lithography system (10) that creates a pattern (230) having a plurality of densely packed parallel lines (232) on a workpiece (22) includes a patterning element (16); an EUV illumination system (12) that directs an extreme ultraviolet beam (13A) at the patterning element (16); a projection optical assembly (18) that directs the extreme ultraviolet beam diffracted off of the patterning element (16) at the workpiece (22); and a pattern blind assembly (26) positioned in a beam path (55) of the extreme ultraviolet beam (13A). The pattern blind assembly (26) shapes the extreme ultraviolet beam (13A) so that an exposure field (28) on the workpiece (22) has a polygonal shape.

20 Claims, 16 Drawing Sheets

Related U.S. Application Data continuation-in-part of application No. 15/599,197, filed on May 18, 2017.

(60) Provisional application No. 62/504,908, filed on May 11, 2017, provisional application No. 62/490,313, filed on Apr. 26, 2017, provisional application No. 62/487,245, filed on Apr. 19, 2017, provisional application No. 62/353,245, filed on Jun. 22, 2016, provisional application No. 62/352,545, filed on Jun. 20, 2016, provisional application No. 62/338,893, filed on May 19, 2016.

(56) References Cited

U.S. PATENT DOCUMENTS

| | | | |
|---|---|---|---|
| 5,144,363 A | 9/1992 | Wittekoek et al. |
| 5,285,236 A | 2/1994 | Jain |
| 5,477,304 A | 12/1995 | Nishi |
| 5,579,147 A | 11/1996 | Mori et al. |
| 5,614,988 A | 3/1997 | Kato et al. |
| 5,623,853 A | 4/1997 | Novak et al. |
| 5,668,672 A | 9/1997 | Oomura |
| 5,689,377 A | 11/1997 | Takahashi |
| 5,729,331 A | 3/1998 | Tanaka et al. |
| 5,739,899 A | 4/1998 | Nishi et al. |
| 5,835,275 A | 11/1998 | Takahashi et al. |
| 5,854,671 A | 12/1998 | Nishi |
| 5,874,820 A | 2/1999 | Lee |
| 5,892,117 A | 4/1999 | Theriot |
| 6,225,027 B1 | 5/2001 | Replogle et al. |
| 6,225,637 B1 | 5/2001 | Terashima et al. |
| 6,312,134 B1 | 11/2001 | Jain et al. |
| 6,331,710 B1 | 12/2001 | Wang et al. |
| 6,512,573 B2 | 1/2003 | Furter |
| 6,608,665 B1 | 8/2003 | Nishi et al. |
| 7,068,350 B2 | 6/2006 | Nishi et al. |
| 7,671,970 B2 | 3/2010 | Loopstra |
| 8,133,661 B2 | 3/2012 | Chang et al. |
| 8,223,345 B2 | 7/2012 | Hidaka et al. |
| 8,411,249 B2 | 4/2013 | Hidaka et al. |
| 8,502,978 B2 | 8/2013 | Hidaka |
| 8,599,387 B2 | 12/2013 | Hidaka |
| 8,623,588 B2 | 1/2014 | Sewell |
| 8,705,170 B2 | 4/2014 | Williamson et al. |
| 2002/0093636 A1 | 7/2002 | Komatsuda |
| 2004/0165169 A1 | 8/2004 | Antonius et al. |
| 2008/0151211 A1 | 6/2008 | Kaiser |
| 2009/0073404 A1 | 3/2009 | Muramatsu |
| 2009/0268182 A1 | 10/2009 | Staals |
| 2010/0033699 A1 | 2/2010 | Shiraishi |
| 2010/0053584 A1 | 3/2010 | Kajiyama |
| 2010/0231880 A1 | 9/2010 | Kawabe |
| 2011/0013162 A1 | 1/2011 | Kiuchi |
| 2011/0071784 A1 | 3/2011 | Smith et al. |
| 2012/0008150 A1 | 1/2012 | Smith |
| 2013/0188084 A1 | 7/2013 | Goodwin |
| 2013/0308140 A1 | 11/2013 | Goodwin et al. |
| 2013/0330662 A1 | 12/2013 | Goodwin |
| 2014/0023973 A1 | 1/2014 | Marconi et al. |
| 2014/0043665 A1 | 2/2014 | Deguenther |
| 2014/0049761 A1 | 2/2014 | Goodwin |
| 2014/0233011 A1 | 8/2014 | Goodwin et al. |
| 2014/0253892 A1 | 9/2014 | Yu et al. |
| 2014/0377692 A1 | 12/2014 | Patra |
| 2015/0049321 A1 | 2/2015 | Bieling et al. |
| 2015/0338746 A1 | 11/2015 | Tsujikawa |
| 2016/0033866 A1 | 2/2016 | Lu et al. |
| 2016/0349631 A1 | 12/2016 | Nakiboglu |
| 2017/0336716 A1 | 11/2017 | Flagello |

OTHER PUBLICATIONS

International Search Report and Written Opinion of the International Searching Authority for PCT/US17/37786, Nikon Corporation, Aug. 31, 2017 (related matter).

International Search Report for International Application No. PCT/US2012/043186, dated Sep. 14, 2012.

Office Action issued by the U.S. Patent Office in U.S. Appl. No. 15/599,148, dated Mar. 26, 2018.

Office Action issued by the U.S. Patent Office in U.S. Appl. No. 15/599,197, dated Apr. 4, 2018.

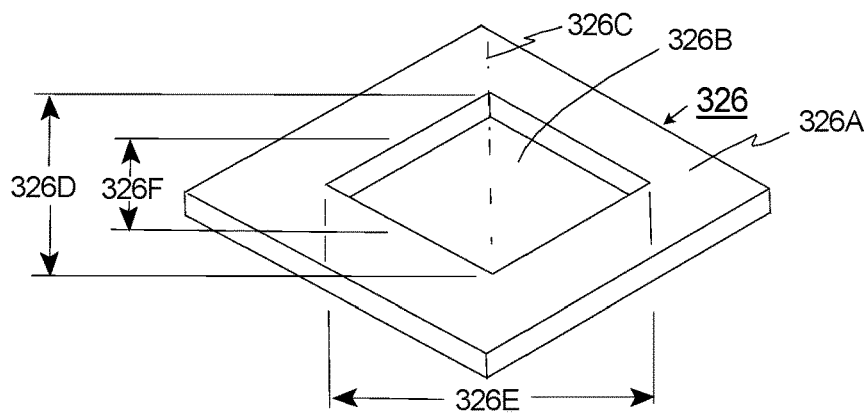
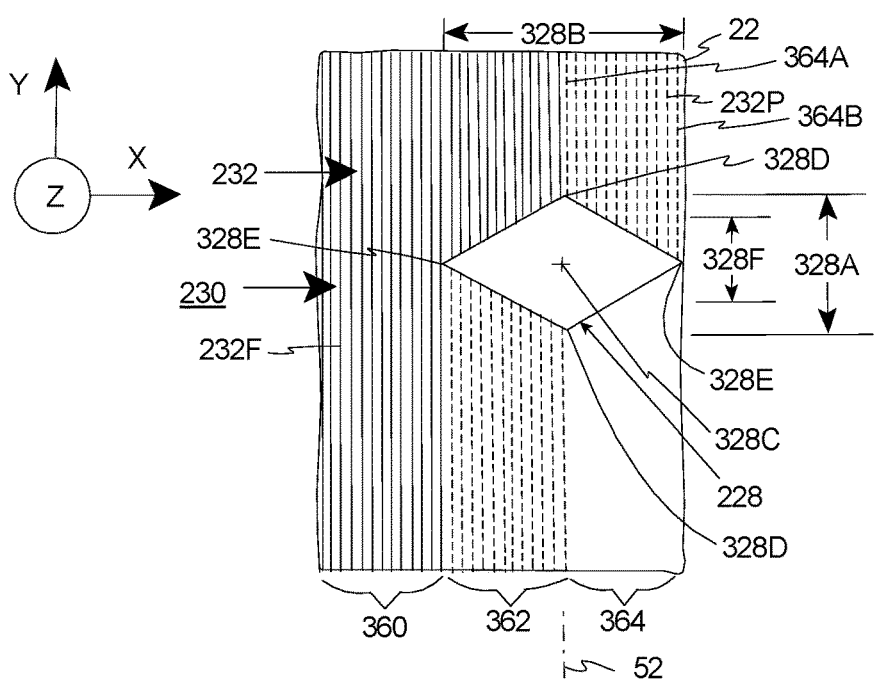
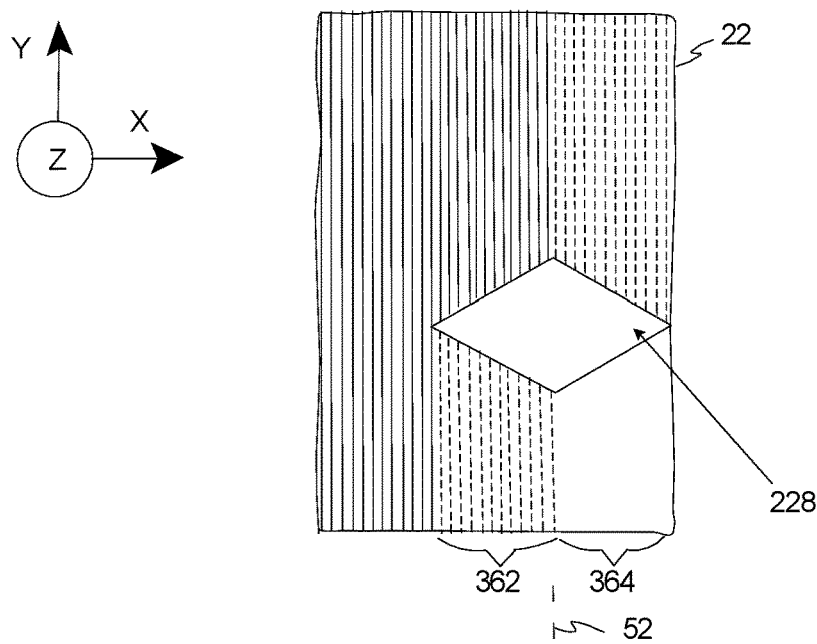
Fig. 3A
Fig. 3B
Fig. 3C

EXTREME ULTRAVIOLET LITHOGRAPHY SYSTEM THAT UTILIZES PATTERN STITCHING

RELATED APPLICATION

The present application is a continuation application of U.S. patent application Ser. No. 15/629,353 filed on Jun. 21, 2017 and titled "Extreme Ultraviolet Lithography System that Utilizes Pattern Stitching". As far as permitted, the contents of U.S. patent application Ser. No. 15/629,353 is incorporated by reference herein for all purposes.

U.S. patent application Ser. No. 15/629,353 claims priority from each and every one of the following Ser. No. 62/353,245 filed on Jun. 22, 2016 and titled "Extreme Ultraviolet Lithography System that Utilizes Pattern Stitching"; Ser. No. 62/487,245 filed on Apr. 19, 2017 and titled "Optical Objective for Dense Line Patterning in EUV Spectral Region"; Ser. No. 62/490,313 filed on Apr. 26, 2017 and titled "Illumination System With Flat 1D-Patterned Mask for Use in EUV-Exposure Tool"; and Ser. No. 62/504,908 filed on May 11, 2017 and titled "Illumination System with Curved 1D-Patterned Mask for Use in EUV-Exposure Tool". As far as permitted, the contents of U.S. Provisional Patent application Ser. No. 62/353,245, Ser. No. 62/487,245, Ser. No. 62/490,313 and Ser. No. 62/504,908 are each incorporated by reference herein for all purposes.

U.S. patent application Ser. No. 15/629,353 is a continuation in part of U.S. patent application Ser. No. 15/599,148, filed on May 18, 2017, and titled "EUV Lithography System for Dense Line Patterning". U.S. patent application Ser. No. 15/599,148 claims priority on U.S. Provisional Patent Application Ser. No. 62/338,893 filed on May 19, 2016 and titled "EUV Lithography System for Dense Line Patterning". As far as permitted, the contents of U.S. patent application Ser. No. 15/599,148, and U.S. Provisional Patent Application Ser. No. 62/338,893 are incorporated herein by reference.

U.S. patent application Ser. No. 15/629,353 is also a continuation in part of U.S. patent application Ser. No. 15/599,197, filed on May 18, 2017, and titled "EUV Lithography System for Dense Line Patterning". As far as permitted, the contents of U.S. patent application Ser. No. 15/599, 197 are incorporated herein by reference.

U.S. patent application Ser. No. 15/629,353 is a continuation in part of International Application No: PCT/US17/37786, filed on Jun. 15, 2017, and titled "Dense Line Extreme Ultraviolet Lithography System with Distortion Matching". International Application No: PCT/US17/37786 claims priority on U.S. Provisional Patent application Ser. No. 62/352,545 filed on Jun. 20, 2016 and titled "Dense Line Extreme Ultraviolet Lithography System with Distortion Matching". As far as permitted, the contents of PCT/US17/37786 and U.S. Ser. No. 62/352,545 are incorporated herein by reference.

BACKGROUND

Lithography systems are commonly used to transfer images from a reticle onto a patternable workpiece, such as a semiconductor wafer or flat panel, during processing. Next generation lithography technology may use extreme ultraviolet (EUV) lithography to enable workpieces, such as semiconductor wafers, with extremely small feature sizes to be fabricated.

SUMMARY

The present embodiment is directed to an extreme ultraviolet lithography system that creates a pattern having a plurality of densely packed parallel lines on a workpiece, such as a semiconductor wafer. The lithography system includes a patterning element; a workpiece stage mover assembly that retains and moves the workpiece relative to the patterning element along a scan axis; an EUV illumination system that directs an extreme ultraviolet beam at the patterning element; a projection optical assembly that creates an image of the patterning element on the workpiece to create the plurality of densely packed parallel lines on the workpiece; and a pattern blind assembly (sometimes also called a field stop assembly) positioned in a beam path of the extreme ultraviolet beam. As provided herein, in one embodiment, the pattern blind assembly shapes the extreme ultraviolet beam so that an exposure field created by the extreme ultraviolet beam on the workpiece has a substantially polygonal shape. Stated in another fashion, a perimeter of the exposure field has a polygonal shape. In this embodiment, the exposure field has a first axis field width measured parallel to the scan axis, a second axis field width measured perpendicular to the scan axis, and a pair of opposed distal second axis vertices located at where the second axis field width is the largest. Moreover, the first axis field width tapers near the distal second axis vertices; in other words, the edges that meet at the distal second axis vertices are not parallel to the first axis (the scanning direction).

As provided herein, the pattern blind assembly is shaped and positioned so that the illumination intensity of the exposure field allows for the overlapping of two or more adjacent exposure fields ("multiple passes of the exposure field") to create a uniform exposure dose across the entire workpiece. This allows for the stitching of exposures of adjacent, subsequent exposure fields in the dense line EUV lithography system.

The polygonal shape of the exposure field can assume just about any three or more sided shape having a regular or irregular shape and a wide range of angles. In one embodiment, the pattern blind assembly has a trapezoidal shaped blind opening so that the exposure field has a trapezoidal shape (i.e., the perimeter is trapezoidal shaped). In another embodiment, the pattern blind assembly can have a diamond shaped blind opening so that the exposure field has a substantially diamond shape (i.e., the perimeter is diamond shaped). In another embodiment, the pattern blind assembly can have a parallelogram shaped blind opening so that the exposure field has a substantially parallelogram shape (i.e., the perimeter is parallelogram shaped). In yet another embodiment, the pattern blind assembly can have an isosceles trapezoid shaped blind opening so that the exposure field has a substantially isosceles trapezoidal shape (i.e., the perimeter is isosceles trapezoidal shaped). In still another embodiment, the pattern blind assembly can have a star shaped blind opening so that the exposure field has a substantially star shape (i.e., the perimeter is star shaped). In yet another embodiment, the pattern blind assembly has a hexagonal shaped blind opening so that the exposure field has a hexagonal shape (i.e., the perimeter is hexagonal shaped). In another embodiment, the pattern blind assembly has a rhomboidal shaped blind opening so that the exposure field has a rhomboidal shape (i.e., the perimeter is rhomboidal shaped). Further, the exposure field can have a concave polygon shape. The polygonal shape facilitates the effective geometrical stitching of the images from subsequently-formed exposure fields. These are just a few possible embodiments. It should be understood that these embodiments are illustrative examples. In actual embodiments, an exposure field of just about any shape may be used.

As provided herein, the workpiece stage mover assembly can move the workpiece along the scan axis (i.e., the Y or first axis) at a constant velocity during a first scanning process and step the substrate a step distance along the X axis (or second axis) after the first scanning process. In certain embodiments, the step distance is less than the X axis field width of the exposure field. For example, the step distance can be equal to or less than one half of the X axis field width. In alternative, non-exclusive embodiments, the step distance can be equal to or less than ⅓, ¼, ⅕, or ⅙ of the X axis field width.

In certain embodiments, it may be preferred for the exposure field is shaped to have a high aspect-ratio (X axis field to Y axis field ratio). In alternative, non-exclusive examples, the exposure field has an aspect-ratio (i) 2 to 1; (ii) 3 to 1; (iii) 4 to 1; (iv) 5 to 1; or (v) 6 to 1.

In one embodiment, the pattern blind assembly shapes the extreme ultraviolet beam so that all points in the exposure field have Z13 astigmatism that is below a predetermined, maximum Z13 astigmatism specification.

In certain embodiments, the X axis field width is selected to align at least one of the distal X axis vertices with an edge of a die on the workpiece.

Additionally, the pattern blind assembly can include a movable shutter that shapes the extreme ultraviolet beam so that at least one of the distal X axis vertices is occluded and the corresponding edge of the exposure field is substantially parallel to the scan axis and aligned with an edge of a die on the workpiece.

In certain embodiments, a second scanning process partly overlaps the first scanning process. Further, the total exposure dose from the first scanning process and the second scanning process in the overlapping region is substantially uniform. As used herein, "substantially uniform dose" shall mean the exposure dose at each point in the exposed area varies by five or less percent. As provided herein, a portion of the pattern is exposed by only the first scanning process, wherein the total exposure dose at each location in the pattern is substantially uniform. Moreover, an additional scanning process partly overlaps the first and second scanning process, wherein the total exposure dose from all of the scanning processes that overlap at each location in the pattern is substantially uniform.

Another embodiment is directed to a method for creating a pattern having a plurality of densely packed parallel lines on a wafer or other workpiece. In this embodiment, the method can include providing a patterning element; moving the workpiece relative to the patterning element along a scan axis with a workpiece stage mover assembly; directing an extreme ultraviolet beam at the patterning element with an EUV illumination system to create the plurality of densely packed parallel lines on the workpiece; and positioning a pattern blind assembly in a beam path of the extreme ultraviolet beam, the pattern blind assembly shaping the extreme ultraviolet beam so that an exposure field created by the extreme ultraviolet beam on the workpiece has a substantially polygonal shape.

In another embodiment, the EUV illumination system includes a first optical system which forms an optically conjugate position of the workpiece. Further, the pattern blind assembly can be arranged on the optically conjugate position.

In certain embodiments, the exposure field includes at least one side which is inclined against the scan axis. Further, in certain embodiments, the polygonal shape of the exposure field is four fold rotationally symmetric about an optical axis of the projection optical assembly.

The present embodiment is also directed to a device manufactured with the above-described lithography system. Such devices may include, but are not limited to, patternable workpieces, flat panel displays, and other workpieces upon which an image has been formed by the lithography system.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 3A is a simplified top perspective view of a first embodiment of a pattern blind assembly for the EUV lithography system of FIG. 1A;

FIG. 3B is a simplified top view of a portion of the workpiece taken from FIG. 2;

FIG. 3C is simplified top view of a portion of the workpiece taken from FIG. 3B with the workpiece moved upward (on the page) along the scan axis;

DESCRIPTION

The present embodiment is directed to an Extreme Ultraviolet Lithography System (EUVL) system that can pattern workpiece substrates, such as semiconductor wafers, flat panel displays, or just about any patternable workpiece surface. For the sake of simplicity, the present embodiment is described in the context of an EUVL system used for patterning semiconductor substrates, such as wafers. It should be understood, however, that the specific semiconductor embodiments described herein should in no way be construed as limiting.

Figure 1A:
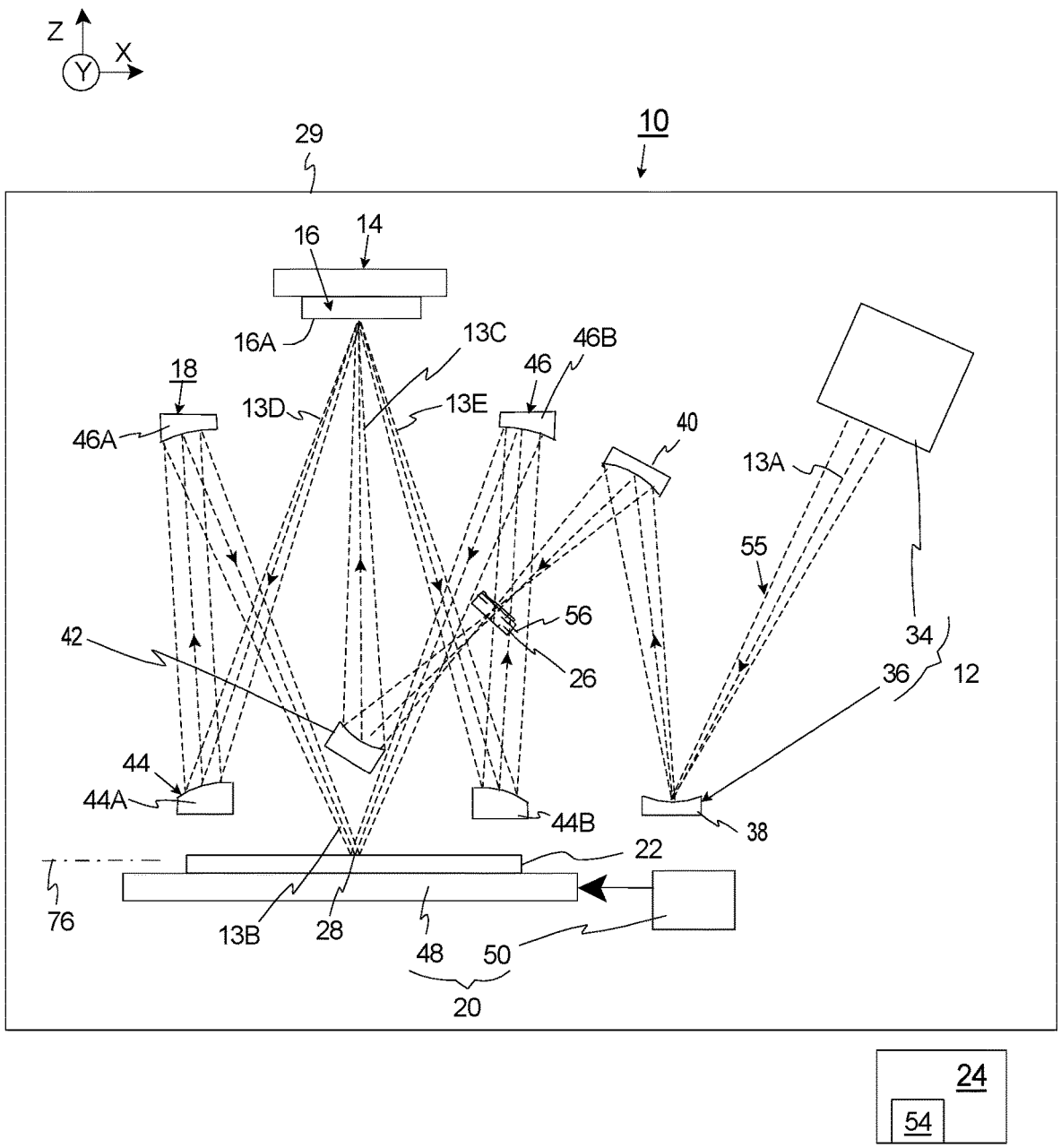
FIG. 1A is a simplified, schematic view illustrating an extreme ultraviolet lithography system having features of the present embodiment.

FIG. 1A is a simplified, non-exclusive, schematic view illustrating an extreme ultraviolet (EUV) lithography system 10 that includes an EUV illumination system 12 (irradiation apparatus) that generates an initial EUV beam 13A (illustrated with dashed lines), a patterning element holder 14 that retains a patterning element 16, a projection optical assembly 18, a workpiece stage assembly 20 that retains and positions a workpiece 22, a control system 24, and a pattern blind assembly 26 that defines the shape of an exposure field 28 on the workpiece 22 created with a shaped and diffracted EUV beam 13B. The design, and location of these components can be varied pursuant to the teachings provided herein. Additionally, it should be noted that the EUV lithography system 10 will typically include more components than illustrated in FIG. 1A. For example, the EUV lithography system 10 can include a rigid apparatus frame (not shown) for retaining one or more of the components of the system. Moreover, the EUV lithography system 10 can include one or more temperature control systems (not shown) that control the temperature of one or more of the components of the EUV lithography system 10. For example, the EUV illumination system 12, the patterning element 16, the projection optical assembly 18, and/or the workpiece stage assembly 20 can require cooling with a temperature control system.

Additionally, for example, the EUV system 10 can include an enclosed chamber 29 that allows for many of components of the EUV lithography system 10 to operate in a controlled environment, such as a vacuum.

As an overview, the EUV lithography system 10 is designed to transfer a pattern 230 (illustrated in FIG. 2) that only includes a plurality of substantially parallel lines 232, which are densely packed onto the workpiece 22. Further, the pattern blind assembly 26 is uniquely designed, shaped, and positioned so that the illumination intensity of the exposure field 28 allows for the partial or full overlapping of two or more adjacent exposure fields 28 to create a substantially uniform exposure dose across the entire workpiece 22. This allows for the stitching of exposures of adjacent, subsequent exposure fields 28 in the dense line EUV lithography system 10.

Some of the Figures provided herein include an orientation system that designates the X axis, the Y axis, and a Z axis that are orthogonal to each other. In these Figures, the Z axis is oriented in the vertical direction. It should be understood that the orientation system is merely for reference and can be varied. For example, the X axis can be switched with the Y axis and/or the stage assembly 10 can be rotated. Moreover, these axes can alternatively be referred to as the first, the second, or a third axis. For example, the X axis can be referred to as the first axis, the Y axis can be referred to as the second axis, and the Z axis can be referred to as the third axis.

The EUV illumination system 12 includes an EUV illumination source 34 and an illumination optical assembly 36. The EUV illumination source 34 emits the initial EUV beam 13A and the illumination optical assembly 36 directs and conditions the EUV beam 13A from the illumination source 34 to provide an adjusted EUV beam 13C that is directed at the patterning element 16. In FIG. 1A, the EUV illumination system 12 includes a single EUV illumination source 34 and a single illumination optical assembly 36. Alternatively, the EUV illumination system 12 could be designed to include a multiple EUV illumination sources 34 and/or multiple illumination optical assemblies 36.

As provided herein, the EUV illumination source 34 emits the EUV beam 13A that is within the EUV spectral range. As provided herein, the "EUV spectral range" shall mean and include wavelengths between approximately five (5) and fifteen (15) nanometers, preferably within a narrow band around 13.5 nanometers. As a non-exclusive example, the EUV illumination source 34 can be a plasma system, such as either a Laser Produced Plasma (LPP) or a Discharge Produced Plasma (DPP). The optical output required from the EUV illumination source 34 will depend on the amount of radiant power necessary for proper exposure of the resist on the workpiece 22 and economical throughput.

The illumination optical assembly 36 is reflective, and includes one or more optical elements that are operable in the EUV spectral range. More specifically, each optical element includes a working surface that is coated to reflect light in the EUV spectral range. Further, the optical elements are spaced apart from each other.

In FIG. 1A, the illumination optical assembly 36 includes a first illumination optical element 38, a second illumination optical element 40, and a third illumination optical element 42 that cooperate to condition the initial EUV beam 13A and direct the conditioned EUV beam 13C at the patterning element 16. In one embodiment, the first illumination optical element 38 is a fly's eye type reflector that includes a plurality of individual, micro-reflectors (micro-mirrors or facets) that are arranged in a two dimensional array, with each reflector including a working surface that is coated to reflect light in the EUV spectral range. Similarly, the second illumination optical element 40 is a fly's eye type reflector that includes a plurality of individual, micro-reflectors (micro-mirrors or facets) that are arranged in a two dimensional array, with each reflector including a working surface that is coated to reflect light in the EUV spectral range. Further, the third illumination optical element 42 is a reflector that includes a working surface that is coated to reflect light in the EUV spectral range. In certain embodiments, the illumination optical elements 38, 40, 42 comprise curved surfaces for focusing the EUV light.

In FIG. 1A, the EUV illumination source 34 emits the initial EUV beam 13 generally downward at the first illumination optical element 38. The plurality of micro-reflectors of the first illumination optical element 38 reflect and redirect the EUV beam generally upward at the second illumination optical element 40. Somewhat similarly, the plurality of micro-reflectors of the second illumination optical element 40 reflect and redirect the EUV beam generally downward at the third illumination optical element 42. Next, the third illumination optical element 42 acts as a relay that collects, reflects, and uniformly focuses the conditioned EUV beam 13C generally upward onto a patterning element surface 16A of the patterning element 16. It should be noted that the faceted mirror surfaces of the first illumination optical element 38 form images of the EUV illumination source 34 at each of the faceted mirror surfaces of the second illumination optical element 40. In response, the faceted mirror surfaces of the second illumination optical element 40 reflect a uniform image of the first illumination optical element 38 via the third illumination optical element 42 onto the patterning element 16. In the embodiment shown, an intermediate image of the first illumination optical element 38 is formed at the intermediate plane 56 between the second illumination optical element 40 and the third illumination optical element 42. Stated in another fashion, each facet of the second illumination optical element 40 is optically conjugate to the EUV source 34 and the third illumination element 42, while each facet of first illumination optical element 38 is optically conjugate to the intermediate image plane 56 and the patterning element 16. With this design, the optical system forms an optically conjugate position of the workpiece. With this arrangement, the image field of each reflector surface of the first illumination optical element 38 overlaps at the patterning element 16 to form a substantially uniform irradiance pattern on the patterning element 16. Further, the pattern blind assembly can be arranged on the optically conjugate position.

The patterning element holder 14 retains the patterning element 16. In one embodiment, the patterning element holder 14 retains the patterning element 16 in a substantially fixed position relative to a moving workpiece 22. Alternatively, the patterning element holder 14 can be designed to make slight adjustments to the position and/or shape of the patterning element 16 to improve the imaging performance of the EUV lithography system 10.

The patterning element 16 can diffract the conditioned EUV beam 13C to create an interference pattern that is projected onto the workpiece 22. For example, the patterning element 16 can be a diffraction grating. In one embodiment, the patterning element surface 16A of the patterning element 16 includes a periodic structure that reflects and diffracts the conditioned EUV beam 13C in multiple directions, including a first diffracted EUV beam 13D and a second diffracted EUV beam 13E that travel in different directions away from the patterning element 16. In one embodiment, the periodic structure of the patterning element 16 includes a pattern of lines parallel to the Y axis. In alternative embodiments, the patterning element 16 may be a periodic structure that alters the phase and/or the intensity of the EUV beam 13C. For example, the periodic structure may be a pattern of reflective and non-reflective lines at an appropriate pitch to create the desired diffracted beams. Alternatively, the periodic structure may be a pattern of lines that vary the optical phase of the EUV light to create the desired diffraction orders.

The projection optical assembly 18 directs the diffracted EUV beams 13D, 13E to form an image of the patterning element 16 onto a light-sensitive photoresist material formed on the semiconductor workpiece 22 positioned at an image plane of the projection optical assembly 18. In one embodiment, the projection optical assembly 18 is reflective and includes one or more optical elements that are operable in the EUV spectral range. More specifically, each optical element includes a working surface that is coated to reflect light in the EUV spectral range. Further, the optical elements are spaced apart from each other.

In FIG. 1A, the projection optical assembly 18 directs EUV light reflected from the patterning element, including the first diffracted EUV beam 13D and the second diffracted EUV beam 13E, at the workpiece 22. Stated in another fashion, with the present embodiment, light waves diffracted or scattered from the patterning element 16 are collected by the projection optical assembly 18 and recombined to produce the image of the patterning element 16 on the workpiece 22. Because the patterning element 16 that scatters/diffracts the EUV beam is imaged onto the workpiece 22, the edges appear as sharp boundaries in the resist of the workpiece 22. Thus, one of the significant advantages of the projection optical system 18 is that it allows for sharp, well-defined edges to the exposure field 28. In FIG. 1A, the projection optical assembly 18 includes a first projection subassembly 44 and a second projection subassembly 46 that cooperate to form the image of the patterning element pattern on the workpiece 22. With the stitching designs provided herein, the sharp edges in the overlap region allow for the lines to be accurately stitched together. In contrast, if the projection optical system 18 merely directs the two diffracted EUV beams 13D, 13E to form an interference pattern on the workpiece 22, the edges will appear out of focus and blurred, and the blurred edges will reduce contrast in the overlap region, which is very difficult to remove.

For example, (i) the first projection subassembly 44 can include a left, first projection optical element 44A, and a right, first projection optical element 44B that cooperate to direct the reflected EUV light; and (ii) the second projection subassembly 46 can include a left, second projection optical element 46A, and a right, second, projection optical element 46B that cooperate to direct the reflected EUV light. In one embodiment, each first projection optical element 44A, 44B is a reflector that includes a working surface that is coated to reflect light in the EUV spectral range. Similarly, each second projection optical element 46A, 46B is a reflector that includes a working surface that is coated to reflect light in the EUV spectral range. In certain embodiments, optical elements 44A, 44B are formed as portions of a single EUV mirror. Similarly, optical elements 46A, 46B may be formed as portions of a single EUV mirror. Depending on the particular application, optical elements 44A, 44B may be two portions of a single curved mirror, or they may be separate components. Similarly, optical elements 46A, 46B may be two portions of a single curved mirror, or they may be separate components.

The workpiece stage assembly 20 holds the workpiece 22, positions and moves the workpiece 22 relative to the exposure field 28 to create the pattern of parallel lines 232 which are densely packed on the workpiece 22. As one non-exclusive example, the workpiece stage assembly 20 can include a workpiece stage 48, and a workpiece stage mover 50 (illustrated as a box).

In the non-exclusive embodiment illustrated in FIG. 1A, the workpiece stage 48 is monolithic and includes a workpiece holder (not shown) that retains the workpiece 22. For example, the workpiece holder can be an electrostatic chuck or some other type of clamp.

The workpiece stage mover 50 controls and adjusts the position of the workpiece stage 48 and the workpiece 22 relative to the exposure field 28 and the rest of the EUV lithography system 10. For example, the workpiece stage mover 50 can move and position of the workpiece 22 with six degrees of freedom, e.g. along the X, Y, and Z axes, and about the X, Y, and Z axes. Alternatively, the workpiece stage mover 50 can be designed to move the workpiece 22 with less than six degrees of freedom, e.g. with three degrees of freedom. As provided herein, the workpiece stage mover 50 can include one or more planar motors, linear motors, voice coil motors, attraction only actuators, and/or other types of actuators.

As provided herein, in one embodiment, during a first scanning process, with the shaped and diffracted EUV beam on, the workpiece stage mover 50 moves the workpiece 22 in a first direction along a scan axis 52 (into the page in FIG. 1A, illustrated in FIG. 2, and parallel to the Y axis) relative to the exposure field 28 to create at least a portion of a first set of parallel lines (not shown in FIG. 1A) on the workpiece 22. Subsequently, during a first stepping process, with the shaped and diffracted EUV beam 13B off, the workpiece stage mover 50 moves (steps) the workpiece 22 along a stepping axis 76 (e.g. along the X axis) which is transverse to the scan axis 52. Next, during a second scanning process, with the shaped and diffracted EUV beam 13B on, the workpiece stage mover 50 moves the workpiece 22 in a second direction (opposite the first direction; out of the page in FIG. 1A) along the scan axis 52 relative to the exposure field 28 to create at least a portion of a second set of parallel lines (not shown in FIG. 1A) on the workpiece 22. Subsequently, during a second stepping process, with the shaped and diffracted EUV beam 13B off, the workpiece stage mover 50 again moves (steps) the workpiece 22 along the stepping axis 76. The scanning processes and stepping processes are alternatively performed until the entire pattern 230 (illustrated in FIG. 2) of parallel lines 232 (illustrated in FIG. 2) are created on the workpiece 22.

In certain embodiments, the scanning velocity can be varied according to the size of the exposure field 28. Further, in certain embodiments, the workpiece stage mover 50 moves the workpiece 22 at a substantially constant velocity during each of the scanning processes.

It should be noted that in certain embodiments, the patterning element 16 is substantially stationary during the scanning and stepping processes.

The control system 24 is electrically connected and directs and controls (i) electrical current to the workpiece stage assembly 20 to control the position of the workpiece 22, and (ii) the EUV illumination system 12 to control the EUV beam 13. The control system 24 can include one or more processors 54, and electronic data storage.

The pattern blind assembly 26 shapes the EUV beam and defines the shape of the exposure field 28 imaged on the workpiece 22. In one embodiment, the pattern blind assembly 26 shapes the EUV beam so that the exposure field 28 formed on the image surface of the workpiece 22 is polygonal shaped. The term "polygon" is intended to be broadly construed to cover any three or more sided planer shape having line segments intersecting at an angle. As specific, non-exclusive examples, the pattern blind assembly 26 can shape the EUV beam so that the exposure field 28 (and its perimeter) is (i) regular polygonal shaped, (ii) irregular polygonal shaped, (iii) four sided polygonal shaped, (iv) trapezoidal shaped, (v) rhombus shaped, (vi) diamond shaped, (vii) isosceles trapezoidal shaped, (viii) star shaped, (ix) hexagonal shaped, (x) concave polygon shaped, (xi) four sided (isotoxal) star polygon shaped, and/or (xii) parallelogram shaped. Again, these recited polygons are merely exemplary and should in no way be construed as limiting. Polygons of a wide variety of shapes and sizes may be used, but are too exhaustive to list and/or describe herein.

In certain embodiments, the exposure field 28 includes at least one side which is inclined against the scan axis 52. Further, in certain embodiments, the polygonal shape of the exposure field 28 is four fold rotationally symmetric about an optical axis of the projection optical assembly 18.

Figure 1B:
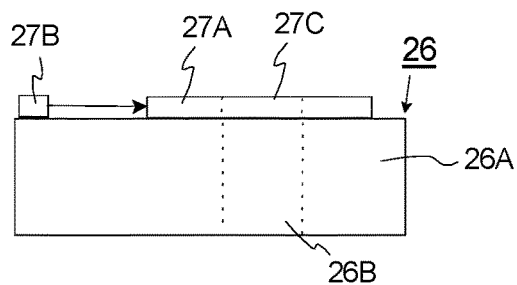
FIG. 1B is a simplified side view of a pattern blind assembly having features of the present embodiment.

FIG. 1B is a simplified side view of a non-exclusive example of the pattern blind assembly 26. In this embodiment, the pattern blind assembly 26 includes a rigid blind body 26A that defines a blind opening 26B (illustrated with dashed lines), a movable shutter 27A (illustrated with a box), and a shutter mover 27B (illustrated with a box). In this embodiment, the blind opening 26B defines an optical aperture structured to dimension, shape and size of the exposure field 28 (illustrated in FIG. 1A) on the image surface of the workpiece 22. For example, the blind opening 26B (and its perimeter) can be (i) regular polygonal shaped, (ii) irregular polygonal shaped, (iii) four sided polygonal shaped, (iv) trapezoidal shaped, (v) rhombus shaped, (vi) diamond shaped, (vii) isosceles trapezoidal shaped, (viii) star shaped, (ix) hexagonal shaped, (x) concave polygon shaped, (xi) four sided (isotoxal) star polygon shaped, and/or (xii) parallelogram shaped.

It should be noted that in certain embodiments, the movable shutter 27A can be selectively moved by the shutter mover 27B relative to the blind opening 26B to selectively cover a portion, cover all, or not cover the blind opening 26B to adjust the size, shape, and/or dimensions of the exposure field 28 along the Y axis (illustrated in FIG. 1A).

In FIG. 1B, the movable shutter 27A includes a shutter opening 27C. With this design, the movable shutter 27A can be moved back and forth to selectively and alternatively adjust the size of the exposure field 28 from either direction along the Y axis (the scan direction) and/or from either direction along the X axis (perpendicular to the scan directions).

Further, the shutter mover 27B can be a motor that is controlled by the control system 24 (illustrated in FIG. 1A) to selectively and alternatively adjust the size of the exposure field 28 from either direction along the Y axis during the scanning process, depending upon the scan direction and/or from either direction along the X axis.

As provided herein, the pattern blind assembly 26 can be positioned in a number of different locations along a beam path 55 between the EUV illumination source 34 and the workpiece 22. For example, the pattern blind assembly 26 can be positioned along the beam path 55 (i) in proximity to the patterning element 16, (ii) in proximity to the workpiece 22, or (iii) at an intermediate image plane. In the embodiment illustrated in FIG. 1A, the pattern blind assembly 26 is positioned along the beam path 55 at an intermediate image plane 56 between the second illumination optical element 40 and the third illumination optical element 42. As a result thereof, the conditioned EUV beam 13C directed at the patterning element 16 is already shaped. In alternative embodiments that have an intermediate image plane at another location, such as between the patterning element 16 and the workpiece 22, the pattern blind assembly 26 can be positioned along the beam path 55 at that intermediate image plane (not shown).

As a result of the pattern blind assembly 26, the shaped and diffracted EUV beam 13C directed at the workpiece 22 has a shape that allows for the overlapping of two adjacent exposure fields 28 to create a uniform exposure dose across the entire workpiece 22. This allows for the "stitching" or smooth transition between exposures of partially overlapping, subsequent exposure fields 28 in the dense line EUV lithography system 10.

It should be noted that any of EUV beams 13A, 13C, 13D, 13E can be referred to generally as an EUV beam. Further, as used herein, the term beam path 55 shall refer to the path that the EUV beam travels from the illumination source 34 and the workpiece 22.

It should also be noted that the pattern blind assembly 26 illustrated in FIG. 1A is designed to operate in transmission mode. Alternatively, the pattern blind assembly 26 can be designed, positioned, and structured to reflect light to create the polygonal shaped exposure field 28.

Figure 2:
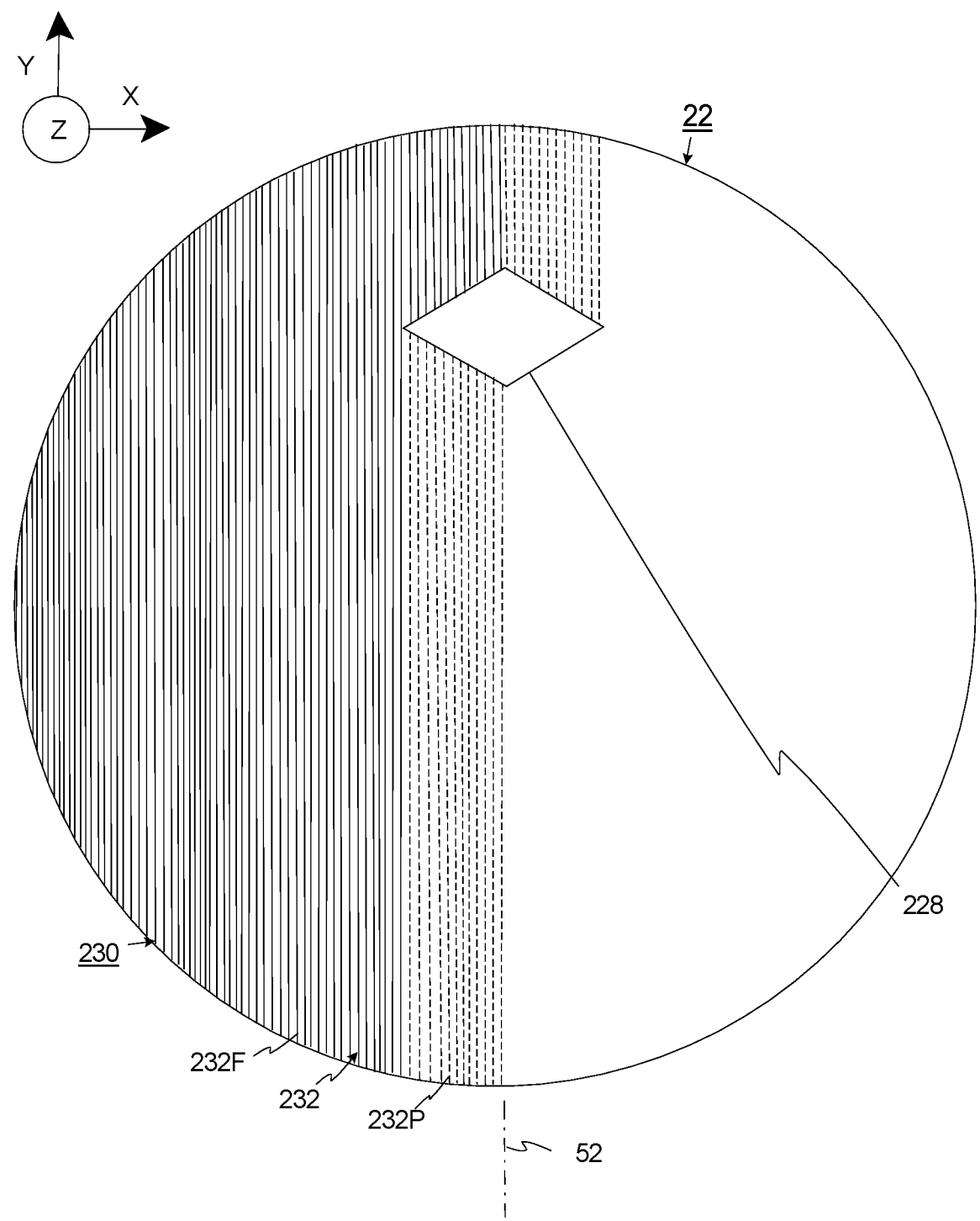
FIG. 2 is a simplified illustration of a workpiece that includes a pattern of parallel lines formed with the EUV lithography system of FIG. 1A.

FIG. 2 is a simplified illustration of the workpiece 22 that includes a pattern 230 of parallel lines 232 formed with the EUV lithography system 10 of FIG. 1A. In this embodiment, only a portion of the pattern 230 (approximately half) has been transferred to the workpiece 22. When finished, substantially the entire workpiece surface will include the parallel lines 232. Further, the EUV lithography system 10 is substantially only used to create the parallel lines 232 on workpieces 22; in some embodiments the EUV lithography system 10 may be used to print a small number of other features, such as alignment marks, on the wafer.

As provided herein, the pattern 230 includes the plurality of parallel lines 232 that are densely packed. In this embodiment, each of the parallel lines 232 extends across the entire workpiece 22 substantially parallel to the Y axis. It should be noted that the parallel lines 232 shown in FIG. 2 are merely illustrative. It should be understood that in one (i.e. semiconductor wafer) non-exclusive embodiment, the spacing (pitch) between adjacent parallel lines 232 may range from ten (10) to forty (40) nanometers. It should be understood, however, that this pitch range should not be construed as limiting. Parallel lines 232 having a pitch smaller than ten (10) nanometers or larger than forty (40) nanometers can be patterned onto a workpiece 22 using the EUVL tool 10. In alternative, non-exclusive examples, the adjacent parallel lines 232 can have a pitch of less than seventy, sixty, fifty, forty, thirty, twenty, ten or five nanometers. Furthermore, as used herein, the phrase "densely packed" means a substantially continuous pattern of lines. While in most cases the densely packed lines will cover substantially an entire workpiece surface, this is by no means a requirement. In alternative embodiments, the parallel lines may have periodic gaps and/or variations in pitch.

It should be noted that a first embodiment of the exposure field 228 created by the lithography system 10 on the workpiece 22 is also illustrated in FIG. 2, as well as the scan axis 52 of the workpiece 22 relative to the exposure field 228. At this time, the workpiece 22 is being moved upward (on the page) along the scan axis 52 relative to the exposure field 228.

As provided herein, depending upon the design of the exposure field 228, portions or the entire the workpiece 22 must be scanned by the exposure field 228 at least two times to fully create the parallel lines. It should be noted that partly created parallel lines 232P are illustrated with dashed lines and fully created parallel lines 232F are illustrated with solid lines.

FIG. 3A is a simplified top perspective view of a first embodiment of a pattern blind assembly 326 that can be used in the EUV lithography system 10 of FIG. 1A. In this embodiment, the pattern blind assembly 326 has a rigid blind body 326A (diamond shaped in this example) that defines a four sided, polygonal shaped blind opening 326B centered on a blind axis 326C. More specifically, in FIG. 3A, the blind opening 326B is diamond (rhombus) shaped. With this design, the pattern blind assembly 326 can be positioned along the beam path 55 (illustrated in FIG. 1A) with the blind axis 326C coaxial with the beam path 55, to create a diamond (rhombus) shaped exposure field 228 (illustrated in FIG. 3B) on the workpiece 22 (illustrated in FIG. 3B).

It should be noted that the blind opening 326B has (i) a Y axis blind width 326D that corresponds to and sets a Y axis field width 328A (illustrated in FIG. 3B) of the exposure field 228 along the Y axis, and (ii) an X axis blind width 326E that corresponds to and sets an X axis field width 328B (illustrated in FIG. 3B) of the exposure field 228 along the X axis. At any X axis location within the X axis blind width 326E, an intermediate Y axis blind width 326F is defined. In this embodiment, the intermediate Y axis blind width 326F decreases (tapers) as you move away from the blind axis 326C. More specifically, in this embodiment, the intermediate Y axis blind width 326F tapers substantially linearly with the X distance from the blind axis 326C. In other words, the intermediate Y axis blind width 326F decreases from a maximum (equal to the Y axis blind width 326D) at the blind axis 326C in a substantially linear manner to zero at the extreme ends of X axis blind width 326E. In some embodiments, the edges of the blind opening 326B may be adjustable or slightly curved to provide compensation for variations in the irradiance of the EUV light across the exposure field 228. In the embodiments provided herein, the Y axis field width 328A is parallel to the scan axis 52 and the X axis field width 328B is perpendicular to the scan axis 52.

FIG. 3B is a simplified top view of a portion of a workpiece 22 taken from FIG. 2, including the pattern 230 of parallel lines 232 transferred onto a portion thereof. FIG. 3B also illustrates the exposure field 228 that is projected onto the workpiece 22 by the EUV lithography system 10 (illustrated in FIG. 1A).

As provided herein, the workpiece 22 is scanned (moved) along the scan axis 52 under the exposure field 228 at least two times to fully create each of the parallel lines 232. Thus, for each scan of the workpiece 22 under the exposure field 228, a portion of the parallel lines 232 are formed.

In FIG. 3B, the partly created parallel lines 232P are illustrated with dashed lines and the fully created parallel lines 232F are illustrated with solid lines. Thus, the solid lines to the left and above on the left of the exposure field 228 represent fully created parallel lines 232F; while the dashed lines below the exposure field 228 represent partly created parallel lines 232P that were partially exposed during the previous scanning process, and the dashed lines above the exposure field 228 represent partly created parallel lines 232P that were partially exposed during the current scanning process. In this example, the workpiece 22 is being moved upward along the scan axis 52 relative to the stationary exposure field 228 during this scanning process.

As provided above, because of the shape of the blind opening 326B (illustrated in FIG. 3A), the exposure field 228 has (i) the Y axis field width 328A parallel to the scan axis 52 (Y axis); and (ii) the X axis field width 328B along the X axis (step direction). Additionally, the exposure field 228 has a field center 328C; a pair of opposed distal Y axis vertices 328D (located at the largest Y axis field width 328A); and a pair of opposed distal X axis vertices 328E (located at the largest X axis field width 328B).

With this design of the exposure field 228, for a given scan speed and intensity of the EUV beam, the size of the Y axis field width 328A influences the dosage of the EUV beam 13B directed at the workpiece 22, while the X axis field width 328B influences how many lines 232F are being created during that scan. In this embodiment, an intermediate Y axis field width 328F decreases (e.g. tapers linearly) as you move away from a field center 328C of the exposure field 228 along the X axis (perpendicular to the scan axis 52) towards the distal X axis vertices 328E. Thus, the exposure dosage will decrease as you move away from the field center 328C of the exposure field 228 (and the distal Y axis vertices 328D) in each direction along the X axis towards the distal X axis vertices 328E. In FIG. 3B, the exposure dose (and intermediate Y axis field width 328F) decreases linearly from approximately 100 percent near the center 328C to approximately zero percent near the distal X axis vertices 328E.

Further, in the simplified example of FIG. 3B, the exposure field 22 is illustrated as creating portions of twenty-four parallel lines 232 during each pass. Typically, however, the parallel lines 232 have a spacing (pitch) on the order of 10 to 20 nanometers, so an actual exposure field would create portions of millions of parallel lines 232 on each pass.

For ease of discussion of FIG. 3B, twelve illustrated parallel lines 232 (which correspond to a large number of actual parallel lines 232) can be grouped and referred to as a set of lines. In the simplified example of FIG. 3B, the workpiece includes (i) a first set of lines 360 (the leftmost twelve lines) that are fully formed, (ii) a second set of lines 362 (the center twelve lines) that are in the process of being fully formed during this scanning process, and (iii) a third set of lines 364 (the rightmost twelve line) that are in the process of being partly formed during this scanning process. In the area of the first set of lines 360, the workpiece 22 has been exposed twice by the exposure field 228. Further, in the area of the second set of lines 362, the workpiece 22 is in the process of being exposed a second time by the exposure field 228 as the workpiece 22 is being moved upward along the scan axis 52 relative to the exposure field 228. Moreover, in the area of the third set of lines 364, the workpiece 22 is in the process of being exposed for the first time by the exposure field 228 as the workpiece 22 is being moved upward along the scan axis 52 relative to the exposure field 228. With the present design, during a single scan of the workpiece 22, an area of the workpiece that includes one set of lines (e.g. the second set of lines 362 in FIG. 3B) is making a second pass through the exposure field 228 and this set of lines are being fully formed; while a different area of the workpiece that will include a different set of lines (e.g. the third set of lines 364 in FIG. 3B) are making a first pass through the exposure field 228 and are being partly formed.

As a result thereof, the adjacent lines can be stitched together because the exposure field 228 has a shape (and illumination intensity distribution) that allows for overlapping of two adjacent fields to create a uniform exposure dose across the entire workpiece 22. It should be noted that with the present design, for the scan illustrated in FIG. 3B, (i) the dosage amount received by the lines of the second set of lines 362 will decrease moving from right to left; and (ii) the dosage amount received by the lines of the third set of lines 364 will decrease moving from left to right. However, in the previous scan (not shown), the dosage amount received by the lines of the second set of lines 362 was respectively larger moving from right to left.

As a specific example, the leftmost line 364A and the rightmost line 364B of the third set of lines 364 have been labeled. For the scan illustrated in FIG. 3B, the leftmost line 364A is positioned near the field center 328C where the intermediate Y axis field width 328F is the widest (and is substantially equal to the Y axis field width 328A), and the rightmost line 364B is positioned near one of the distal X axis vertices 328E where the intermediate Y axis field width 328F is the narrowest (substantially zero in this example). As a result thereof, the leftmost line 364A will receive approximately 100 percent dosage during the current scan, while the rightmost line 364B will receive approximately zero dosage during the current scan.

FIG. 3C is simplified top view of a portion of a workpiece 22 taken from FIG. 3B with the workpiece 22 moved upward (on the page) along the scan axis 52 relative to the stationary exposure field 228. Comparing FIGS. 3B and 3C, a greater portion of the second set of lines 362 have been fully formed, and a greater portion of the third set of lines 364 have been partly formed.

Figure 3D:
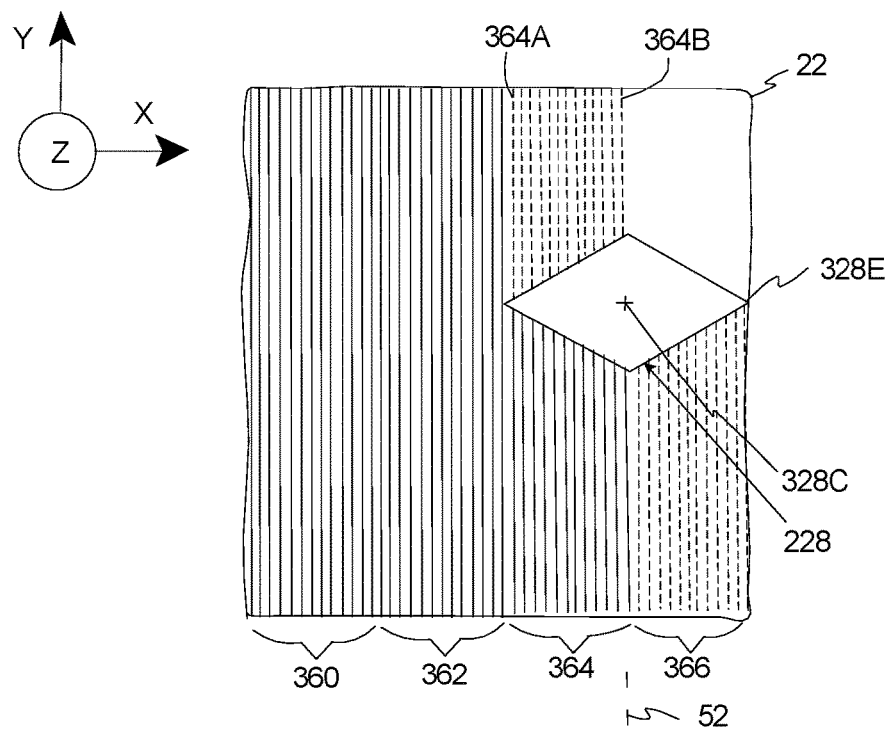
FIG. 3D is simplified top view of a portion of the workpiece after the scan process illustrated in FIGS. 3B and 3C has been completed and the next scan process has started.

FIG. 3D is simplified top view of a portion of a workpiece 22 after the scanning process illustrated in FIGS. 3B and 3C has been completed and the next scanning process is being performed. As a result thereof, (i) the first set of lines 360 and the second set of lines 362 are fully formed, (ii) the third set of lines 364 are in the process of being fully formed during this scanning process, and (iii) a fourth set of lines 366 are now in the process of being partly formed during this scanning process.

Comparing FIGS. 3B and 3D, the workpiece 22 is now being moved in the downward direction (on the page) along the scan axis 52 and the workpiece 22 has been stepped to the left (along the X axis) between the scanning steps.

In FIG. 3D, the leftmost line 364A and the rightmost line 364B of the third set of lines 364 have again been labeled. For the scan illustrated in FIG. 3D, the leftmost line 364A is positioned near one of the distal X axis vertices 328E where the intermediate Y axis field width 326F (illustrated in FIG. 3B) is the narrowest, and the rightmost line 364B is positioned near the field center 328C where the Y axis field width 328B is the widest. As a result thereof, during this scan, the leftmost line 364A will receive approximately zero dosage, while the rightmost line 364B will receive approximately one hundred percent dosage. This is opposite of the dosages received by the third set of lines 364 in the previous scanning process. In this way, all of the third set of lines 364 will receive approximately equal exposure dosage, and the ratio of dosage from the current scan and the subsequent scan will vary smoothly from leftmost line 364A to rightmost line 364B. As result thereof, the present embodiment allows for the stitching of adjacent exposures together while maintaining a uniform exposure dose for all of the exposed lines 232 on the workpiece 22 without undesirable discontinuities between exposure passes.

Figure 3E:
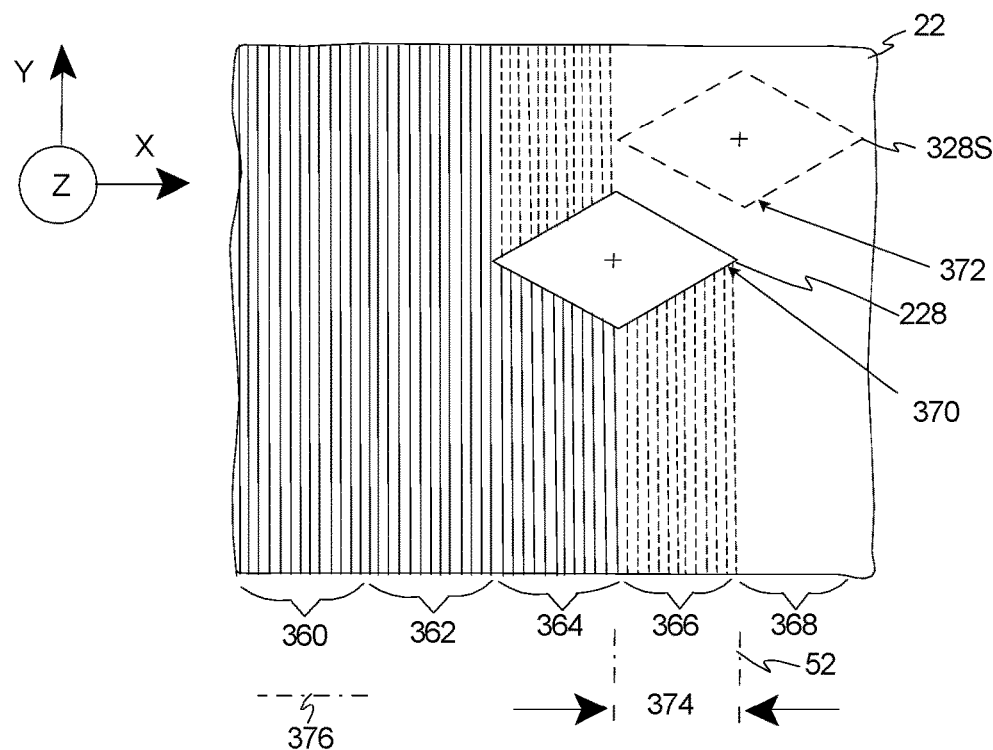
FIG. 3E is simplified top view of a portion of the workpiece with two exposure fields illustrated.

FIG. 3E is a simplified illustration of the workpiece 22 from FIG. 3D with a subsequent exposure field 328S illustrated with long dashes. It should be noted that only one exposure field 228, 328S is directed at the workpiece 22. The subsequent exposure field 328S is only illustrated in FIG. 3E to shown how the subsequent (in time) exposure field 328S will partly (approximately one-half in this example) overlap ("overlap region") the exposure field 228 to allow for stitching of the adjacent exposures. Further, the exposure fields 228, 328S are illustrated in different locations for ease of illustration. However, in practice the exposure field 228, 328S remains at the same location while the workpiece 22 will have been moved.

For ease of discussion, the scanning process of exposure field 228 can be referred to as a first scanning process 370 and the scanning process of the subsequent exposure field 328S can be referred to as a second scanning process 372. During the first scanning process 370, (i) the workpiece 22 is being moved downward relative to the exposure field 228, (ii) the third set of lines 364 are in the process of being fully formed, and (iii) a fourth set of lines 366 are now in the process of being partly formed. In contrast, during the second scanning process 372, (i) the workpiece 22 is being moved upward relative to the exposure field 328S, (ii) the fourth set of lines 366 are in the process of being fully formed, and (iii) a fifth set of lines 368 (just the area of the lines are shown) are now in the process of being partly formed.

As provided herein, the exposure field 228 is uniquely shaped, and positioned so that the illumination intensity of the exposure field 228 allows for the overlapping of two adjacent exposure fields 228, 328S to create a uniform exposure dose across the entire workpiece 22. When the second exposure is made with a corresponding (preferably linear) taper in the opposite direction, the total dose is maintained. This allows for the stitching of exposures of adjacent, subsequent exposure fields 28 in the dense line EUV lithography system 10.

It should be noted that between each of the scanning processes 370, 372, the workpiece 22 is stepped a step distance 374 along a step axis 376 (e.g. the X axis) that is perpendicular to the scan axis 52. The size of the step distance 374 between scanning processes 370, 372 can vary according to the design of the exposure field 228. In FIG. 3E, the step distance 374 is equal to approximately one half of the maximum X axis field width 328B (illustrated in FIG. 3B) of the exposure field 22. This will result in an overlap of approximately fifty percent of the sequential exposures. Alternatively, for different shaped exposure fields, the amount of overlap can be more or less than fifty percent and the step distance will correspondingly be more or less than fifty percent of the maximum X axis field width 328B. For example, with the same shape for the exposure field 22, the size of the step distance 374 could be one quarter of the X axis field width 328B. In this case, there would be a seventy-five percent overlap between sequential scanning exposures, and each set of the parallel lines would be formed by a combination of four exposures.

Figure 4A:
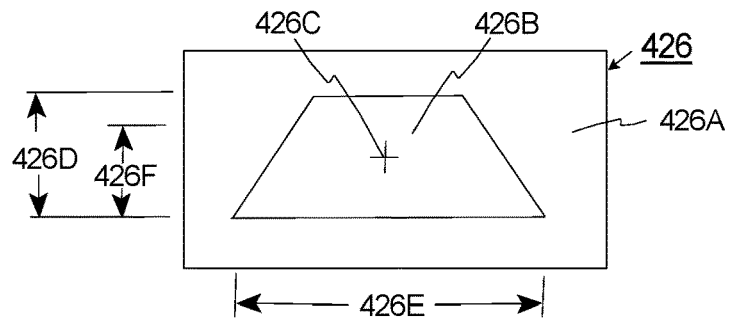
FIG. 4A is a simplified top perspective view of another embodiment of a pattern blind assembly for the EUV lithography system of FIG. 1A.

FIG. 4A is a simplified top view of another embodiment of a pattern blind assembly 426 that can be used in the EUV lithography system 10 of FIG. 1A. In this embodiment, the pattern blind assembly 426 has a rigid blind body 426A (rectangular shaped in this example) that defines a four sided, isosceles trapezoidally shaped blind opening 426B centered on a blind axis 426C. With this design, the pattern blind assembly 426 can be positioned along the beam path 55 (illustrated in FIG. 1A) with the blind axis 426C coaxial with the beam path 55, to create an isosceles trapezoidal shaped exposure field 428 (illustrated in FIG. 4B) on the workpiece 22 (a portion of which is illustrated in FIG. 4B).

It should be noted that the blind opening 426B has (i) a Y axis blind width 426D that corresponds to and sets a Y axis field width 428A (illustrated in FIG. 4B) of the exposure field 428 along the Y axis, and (ii) an X axis blind width 426E that corresponds to and sets an X axis field width 428B (illustrated in FIG. 4B) of the exposure field 428 along the X axis. At any X axis location within the X axis blind width 426E, an intermediate Y axis blind width 426F is defined. In this embodiment, the intermediate Y axis blind width 426F decreases (tapers linearly) near the extreme ends (vertices) of X axis blind width 426E. In some embodiments, the edges of the blind opening 426B may be adjustable or slightly curved to provide compensation for variations in the irradiance of the EUV light across the exposure field 428.

Figure 4B:
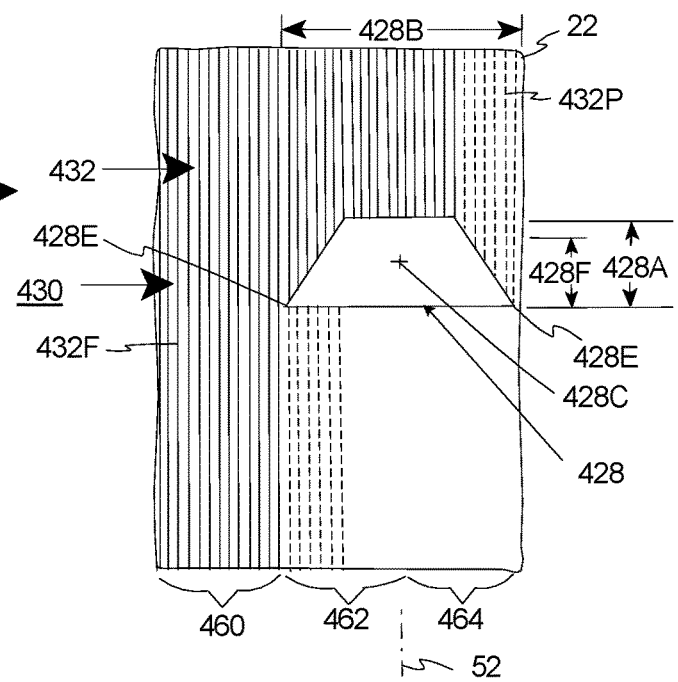
FIG. 4B is a simplified top view of a portion of the workpiece with an exposure field.

FIG. 4B is a simplified top view of a portion of a workpiece 22, including the pattern 430 of parallel lines 432 transferred onto a portion thereof. FIG. 4B also illustrates the exposure field 428 that is projected onto the workpiece 22 by the EUV lithography system 10 (illustrated in FIG. 1A). As provided herein, portions of the workpiece 22 are scanned (moved) along the scan axis 52 under the exposure field 428 so that a portion of the parallel lines 432 are fully formed by each exposure pass and the remaining portion of the parallel lines 432 are formed by combining two exposure passes.

In FIG. 4B, the partly created parallel lines 432P are illustrated with dashed lines and the fully created parallel lines 432F are illustrated with solid lines. In this example, the workpiece 22 is being moved upward along the scan axis 52 relative to the stationary exposure field 428.

As provided above, because of the shape of the blind opening 426B (illustrated in FIG. 4A), the exposure field 428 has (i) the Y axis field width 428A parallel to the scan axis 52 (Y axis); and (ii) the X axis field width 428B along the X axis (step direction). Additionally, the exposure field 428 has a field center 428C; and a pair of opposed distal X axis vertices 428E (located in the vicinity of the largest X axis field width 428B). In this embodiment, an intermediate Y axis field width 428F that decreases (e.g. tapers linearly) as you get closer to the distal X axis vertices 428E.

With this design of the exposure field 428, for a given scan speed and intensity of the EUV beam 13B (illustrated in FIG. 1A), the size of the Y axis intermediate field width 428F influences the dosage of the EUV beam 13B directed at the workpiece 22, while the X axis field width 428B influences how many lines 432F are being created during that scan. In this embodiment, the intermediate Y axis field width 428F is constant for a while (equal to the Y axis field width 428A) in the vicinity (measured along the X axis) of the field center 428C and decreases (e.g. tapers linearly) near the distal X vertices 428E. Thus, for a central portion of the exposure field 428, the exposure dose is substantially constant and the dosage will decrease closer to the distal X vertices 428E of the exposure field 428. In FIG. 4B, the dose (and intermediate Y axis field width 428F) decreases from one hundred percent near the field center 428C to approximately zero near the distal X axis vertices 428E.

Further, in the simplified example of FIG. 4B, the exposure field 428 is again illustrated as creating portions of twenty-four parallel lines 432 during each pass, while in reality the number of parallel lines 432 would be several million or more. In the simplified example of FIG. 4B, the workpiece includes (i) a first set of lines 460 which are fully formed by previous scanning processes, (ii) a second set of lines 462 which were partly formed during a previous scanning process and are in the process of being fully formed during this scanning process, (iii) a third set of lines 463 that are in the process of being fully formed during this scanning process, and (iv) a fourth set of lines 464 that are in the process of being partly formed during this scanning process. More specifically, for the scan example illustrated in FIG. 4B, (i) the six lines of the second set of lines 462 are receiving a second partial dosage; (ii) the twelve lines of the third set of lines 463 are receiving a single, full dosage; and (iii) (iv) the six lines of the third set of lines 464 are receiving a first, partial dosage.

Figure 4C:
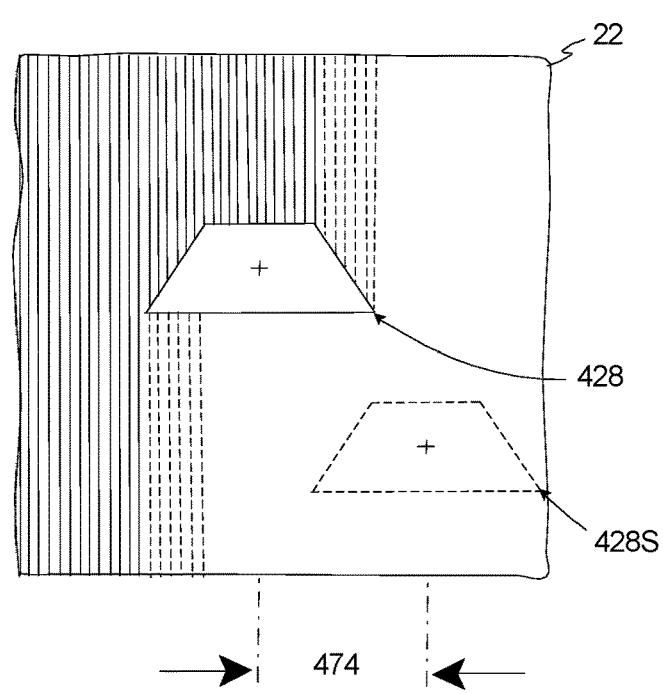
FIG. 4C is simplified top view of a portion of the workpiece with two exposure fields illustrated.

FIG. 4C is a simplified illustration of the workpiece 22 from FIG. 4B with a subsequent exposure field 428S illustrated with long dashes. It should be noted that only one exposure field 428, 428S is directed at the workpiece 22. The subsequent exposure field 428S is only illustrated in FIG. 4C to show how the subsequent (in time) exposure field 428S will partly (approximately one-quarter in this example) overlap the exposure field 428 to allow for stitching of the adjacent exposures. Further, the exposure fields 428, 428S are illustrated in different locations for ease of illustration. However, in practice, the exposure field 428, 428S remains at the same location while the workpiece 22 will have been moved.

As provided herein, the exposure field 428 is uniquely shaped, and positioned so that the illumination intensity of the exposure field 428 allows for the overlapping of two adjacent exposure fields 428, 428S to create a uniform exposure dose across the entire workpiece 22. When the second exposure is made with a corresponding (preferably linear) taper in the opposite direction, the total dose is maintained. This allows for the stitching of exposures of adjacent, subsequent exposure fields 428 in the dense line EUV lithography system 10.

It should be noted that in this example, between each of the scanning processes, the workpiece 22 is stepped a step distance 474 of approximately seventy-five percent the maximum X axis field width 428B (illustrated in FIG. 4B) of the exposure field 422. This will result in an overlap of approximately twenty-five percent for sequential exposures.

Figure 5A:
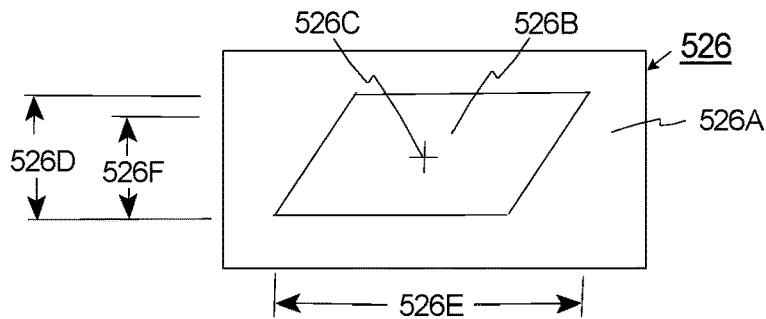
FIG. 5A is a simplified top perspective view of still another embodiment of a pattern blind assembly for the EUV lithography system of FIG. 1A.

FIG. 5A is a simplified top view of another embodiment of a pattern blind assembly 526 that can be used in the EUV lithography system 10 of FIG. 1A. In this embodiment, the pattern blind assembly 526 has a rigid blind body 526A (rectangular shaped in this example) that defines a four sided, parallelogram shaped blind opening 526B centered on a blind axis 526C. With this design, the pattern blind assembly 526 can be positioned along the beam path 55 (illustrated in FIG. 1A) with the blind axis 526C coaxial with the beam path 55, to create a parallelogram shaped exposure field 528 (illustrated in FIG. 5B) on the workpiece 22 (illustrated in FIG. 5B).

It should be noted that the blind opening 526B has (i) a Y axis blind width 526D that corresponds to and sets a Y axis field width 528A (illustrated in FIG. 5B) of the exposure field 528 along the Y axis, and (ii) an X axis blind width 526E that corresponds to and sets an X axis field width 528B (illustrated in FIG. 5B) of the exposure field 528 along the X axis. At any X axis location within the X axis blind width 526E, an intermediate Y axis blind width 526F is defined. In this embodiment, the intermediate Y axis blind width 526F decreases (tapers linearly) near the extreme ends (vertices) of X axis blind width 526E. In some embodiments, the edges of the blind opening 526B may be adjustable or slightly curved to provide compensation for variations in the irradiance of the EUV light across the exposure field 528.

Figure 5B:
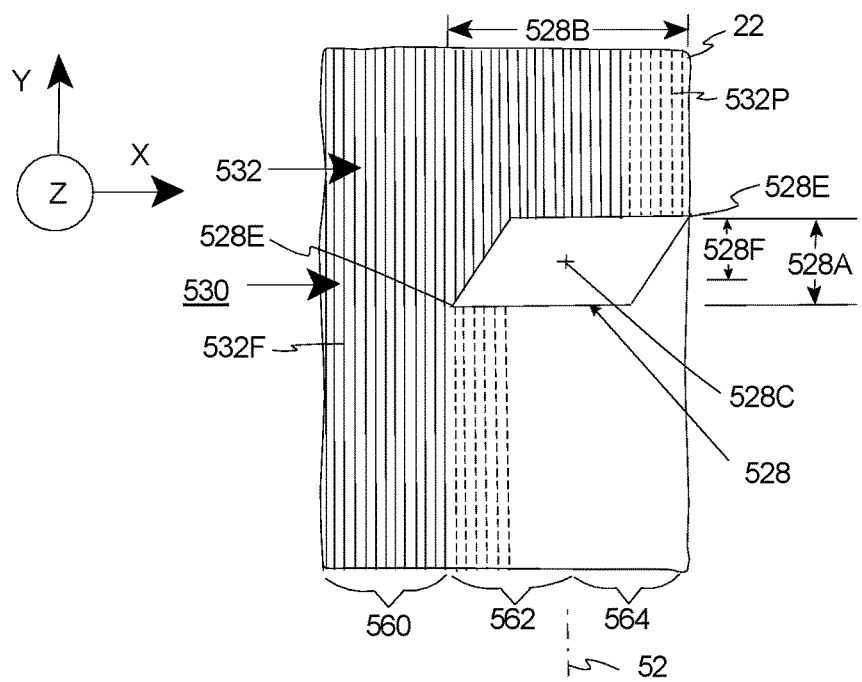
FIG. 5B is a simplified top view of a portion of the workpiece with an exposure field.

FIG. 5B is a simplified top view of a portion of a workpiece 22, including the pattern 530 of parallel lines 532 transferred onto a portion thereof. FIG. 5B also illustrates the exposure field 528 that is projected onto the workpiece 22 by the EUV lithography system 10 (illustrated in FIG. 1A). As provided herein, portions of the workpiece 22 are scanned (moved) along the scan axis 52 under the exposure field 528 at least two times to fully create each of the parallel lines 532.

In FIG. 5B, the partly created parallel lines 532P are illustrated with dashed lines and the fully created parallel lines 532F are illustrated with solid lines. In this example, the workpiece 22 is being moved upward along the scan axis 52 relative to the stationary exposure field 528.

As provided above, because of the shape of the blind opening 526B (illustrated in FIG. 5A), the exposure field 528 has (i) the Y axis field width 528A parallel to the scan axis 52 (Y axis); and (ii) the X axis field width 528B along the X axis (step direction). Additionally, the exposure field 528 has a field center 528C; and a pair of opposed distal X axis vertices 528E which are diagonally oriented in this example. Further, in this embodiment, the exposure field 528 has border lines that are perpendicular to the scan axis 52. Additionally, in this embodiment, an intermediate Y axis field width 528F that decreases (e.g. tapers linearly) as you get closer to the distal X axis vertices 528E.

In this embodiment, the intermediate Y axis field width 528A is constant for a while and decreases (e.g. tapers linearly) near the distal X vertices 528E. Thus, the dosage will decrease closer to the distal X vertices 528E of the exposure field 528. In FIG. 5B, the dose (and Y axis field width 528A) decreases from one hundred percent near the field center 528C to approximately zero percent near the distal X axis vertices 528E.

Further, in the simplified example of FIG. 5B, the exposure field 528 is illustrated to create portions of twenty-four parallel lines 532 during each pass. In the simplified example of FIG. 5B, the workpiece includes (i) the first set of lines 560 that are fully formed, (ii) the second set of lines 562 that are in the process of being fully formed, and (iii) the third set of lines 564 that are in the process of being fully and partly formed. More specifically, for the scan example illustrated in FIG. 5B, (i) the left six lines of the second set of lines 562 are receiving a second partial dosage; (ii) the right six lines of the second set of lines 562 are receiving a single, full dosage; (iii) the left six lines of the third set of lines 564 are receiving a single, full dosage; and (iv) the right six lines of the third set of lines 564 are receiving a first, partial dosage.

Figure 5C:
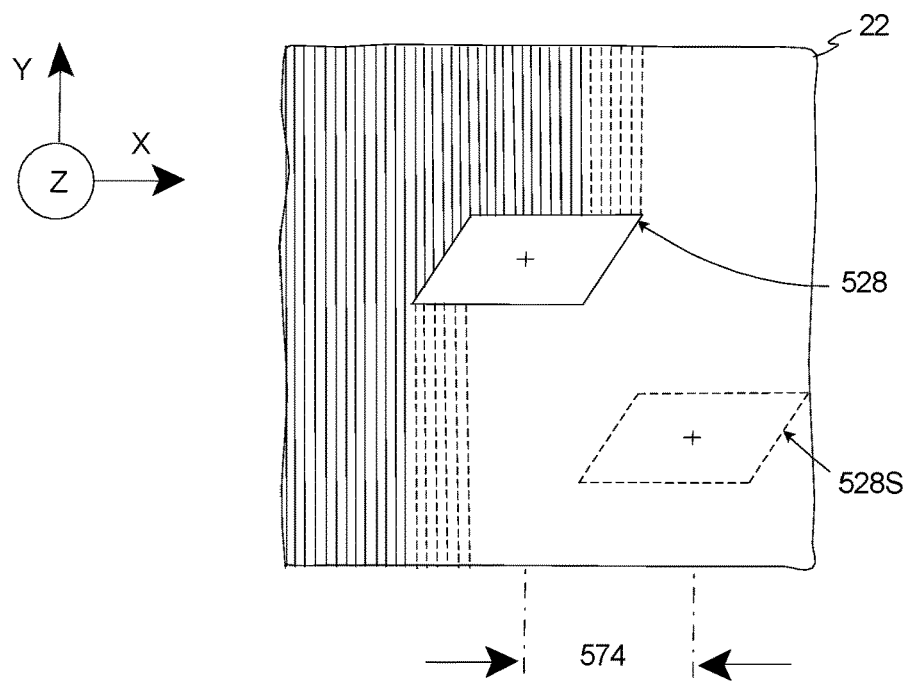
FIG. 5C is simplified top view of a portion of the workpiece with two exposure fields illustrated.

FIG. 5C is a simplified illustration of the workpiece 22 from FIG. 5B with a subsequent exposure field 528S illustrated with long dashes. The subsequent exposure field 528S is only illustrated in FIG. 5C to shown how the subsequent (in time) exposure field 528S will partly (approximately one-quarter in this example) overlap the exposure field 528 to allow for stitching of the adjacent exposures. Further, the exposure field 528, 528S are illustrated in different locations for ease of illustration. However, in practice, the exposure field 528, 528S remains at the same location while the workpiece 22 will have been moved.

As provided herein, the exposure field 528 is uniquely shaped, and positioned so that the illumination intensity of the exposure field 528 allows for the overlapping of two adjacent exposure fields 528, 528S to create a uniform exposure dose across the entire workpiece 22. When the second exposure is made with a corresponding (preferably linear) taper in the opposite direction, the total dose is maintained.

This allows for the stitching of exposures of adjacent, subsequent exposure fields 528 in the dense line EUV lithography system 10.

It should be noted that in this example, between each of the scanning processes, the workpiece 22 is stepped a step distance 574 of approximately seventy-five percent the maximum X axis field width 528B (illustrated in FIG. 5B) of the exposure field 522. This will result in an overlap of approximately twenty-five percent of the sequential exposures.

Figure 6A:
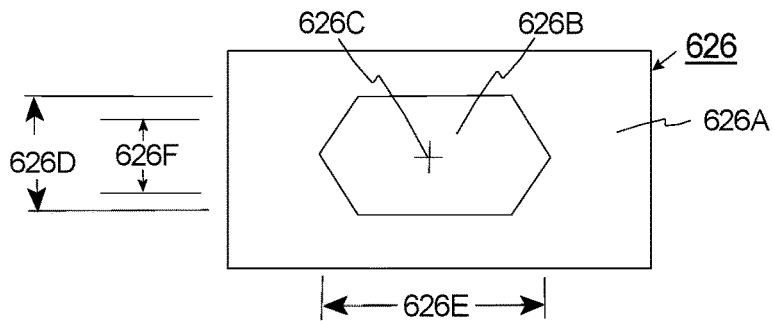
FIG. 6A is a simplified top perspective view of yet another embodiment of a pattern blind assembly for the EUV lithography system of FIG. 1A.

FIG. 6A is a simplified top view of yet another embodiment of a pattern blind assembly 626 that can be used in the EUV lithography system 10 of FIG. 1A. In this embodiment, the pattern blind assembly 626 has a rigid blind body 626A (rectangular shaped in this example) that defines an elongated hexagon shaped blind opening 626B centered on a blind axis 626C. With this design, the pattern blind assembly 626 can be positioned along the beam path 55 (illustrated in FIG. 1A) with the blind axis 626C coaxial with the beam path 55, to create an elongated hexagon shaped exposure field 628 (illustrated in FIG. 6B) on the workpiece 22 (illustrated in FIG. 6B).

It should be noted that the blind opening 626B has (i) a Y axis blind width 626D that corresponds to and sets a Y axis field width 628A (illustrated in FIG. 6B) of the exposure field 628 along the Y axis, and (ii) an X axis blind width 626E that corresponds to and sets an X axis field width 628B (illustrated in FIG. 6B) of the exposure field 628 along the X axis. At any X axis location within the X axis blind width 626E, an intermediate Y axis blind width 626F is defined. In this embodiment, the intermediate Y axis blind width 626F decreases (tapers linearly) near the extreme ends (vertices) of X axis blind width 626E. In some embodiments, the edges of the blind opening 626B may be adjustable or slightly curved to provide compensation for variations in the irradiance of the EUV light across the exposure field 628.

Figure 6B:
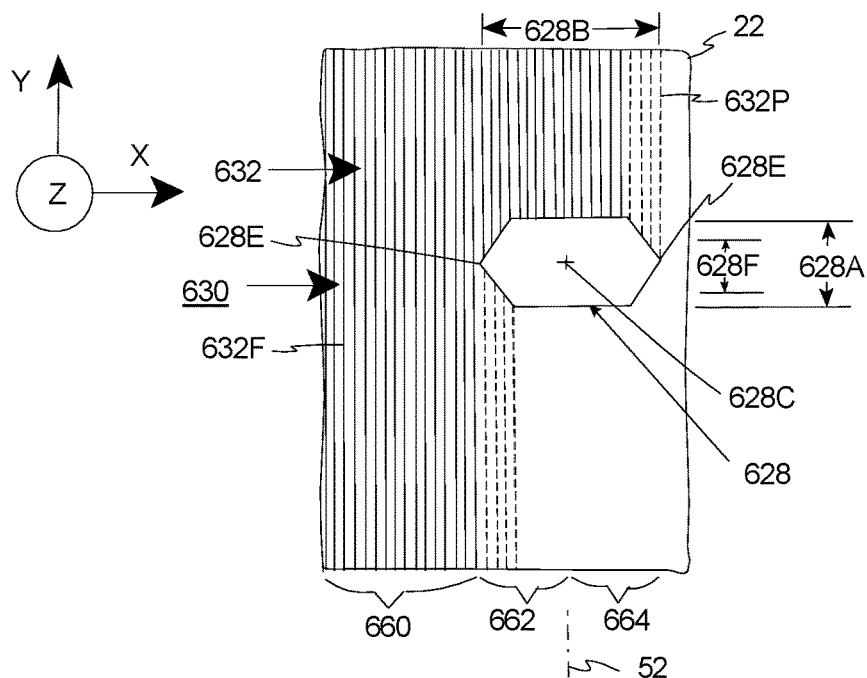
FIG. 6B is a simplified top view of a portion of the workpiece with an exposure field.

FIG. 6B is a simplified top view of a portion of a workpiece 22, including the pattern 630 of parallel lines 632 transferred onto a portion thereof. FIG. 6B also illustrates the exposure field 628 that is projected onto the workpiece 22 by the EUV lithography system 10 (illustrated in FIG. 1A). As provided herein, portions of the workpiece 22 are scanned (moved) along the scan axis 52 under the exposure field 628 at least two times to fully create each of the parallel lines 632.

In FIG. 6B, the partly created parallel lines 632P are illustrated with dashed lines and the fully created parallel lines 632F are illustrated with solid lines. In this example, the workpiece 22 is being moved upward along the scan axis 52 relative to the stationary exposure field 628.

As provided above, because of the shape of the blind opening 626B (illustrated in FIG. 6A), the exposure field 628 has (i) the Y axis field width 628A parallel to the scan axis 52 (Y axis); and (ii) the X axis field width 628B along the X axis (step direction). Additionally, the exposure field 628 has a field center 628C; and a pair of opposed distal X axis vertices 628E. Further, in this embodiment, the exposure field 628 has border lines that are perpendicular to the scan axis 52. Additionally, in this embodiment, an intermediate Y axis field width 628F that decreases (e.g. tapers linearly) as you get closer to the distal X axis vertices 628E.

In this embodiment, the intermediate Y axis field width 628A is constant for a while and decreases (e.g. tapers linearly) near the distal X vertices 628E. Thus, the dosage will decrease closer to the distal X vertices 628E of the exposure field 628. In FIG. 6B, the dose (and Y axis field width 628A) decreases from one hundred percent near the field center 628C to approximately zero percent near the distal X axis vertices 628E.

Further, in the simplified example of FIG. 6B, the exposure field 628 is illustrated to create portions of twenty parallel lines 632 during each pass. In the simplified example of FIG. 6B, the workpiece includes (i) the first set of lines 660 that are fully formed, (ii) the second set of lines 662 that are in the process of being fully formed, and (iii) the third set of lines 664 that are in the process of being fully and partly formed. More specifically, for the scan example illustrated in FIG. 6B, (i) the left four lines of the second set of lines 662 are receiving a second partial dosage; (ii) the right six lines of the second set of lines 662 are receiving a single, full dosage; (iii) the left six lines of the third set of lines 664 are receiving a single, full dosage; and (iv) the right four lines of the third set of lines 664 are receiving a first, partial dosage.

Figure 6C:
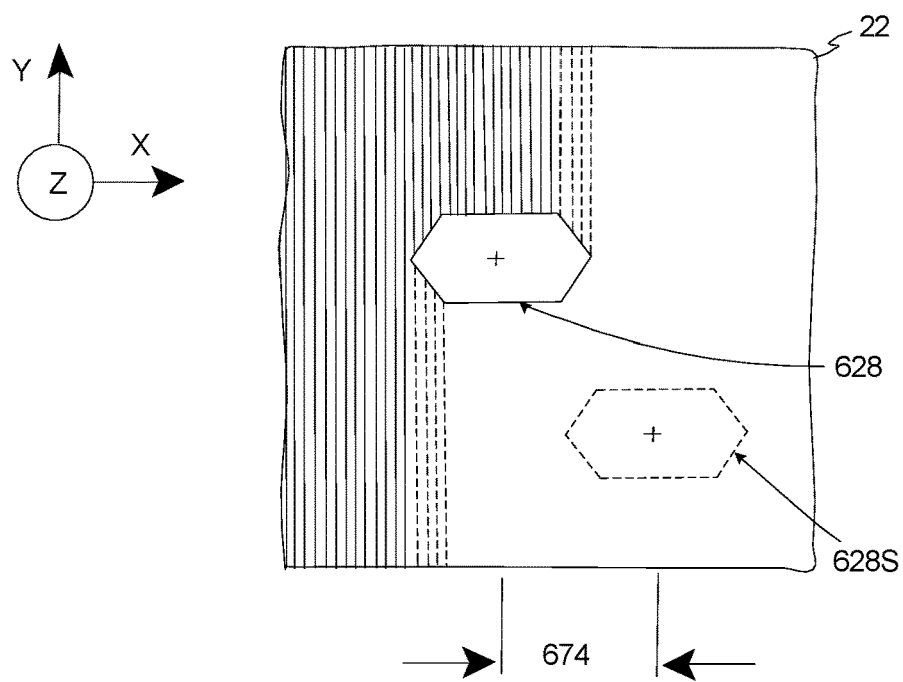
FIG. 6C is simplified top view of a portion of the workpiece with two exposure fields illustrated.

FIG. 6C is a simplified illustration of the workpiece 22 from FIG. 6B with a subsequent exposure field 628S illustrated with long dashes. The subsequent exposure field 628S is only illustrated in FIG. 6C to shown how the subsequent (in time) exposure field 628S will partly (approximately one-quarter in this example) overlap the exposure field 628 to allow for stitching of the adjacent exposures. Further, the exposure field 628, 628S are illustrated in different locations for ease of illustration. However, in practice, the exposure field 628, 628S remains at the same location while the workpiece 22 will have been moved.

As provided herein, the exposure field 628 is uniquely shaped, and positioned so that the illumination intensity of the exposure field 628 allows for the partial overlapping of two adjacent exposure fields 628, 628S to create a uniform exposure dose across the entire workpiece 22. When the second exposure is made, the total dose is delivered.

This allows for the stitching of exposures of adjacent, subsequent exposure fields 628 in the dense line EUV lithography system 10.

It should be noted that in this example, between each of the scanning processes, the workpiece 22 is stepped a step distance 674 of approximately seventy-five percent the maximum X axis field width 628B (illustrated in FIG. 6B) of the exposure field 622. This will result in an overlap of approximately twenty-five percent of the sequential exposures.

Figure 7A:
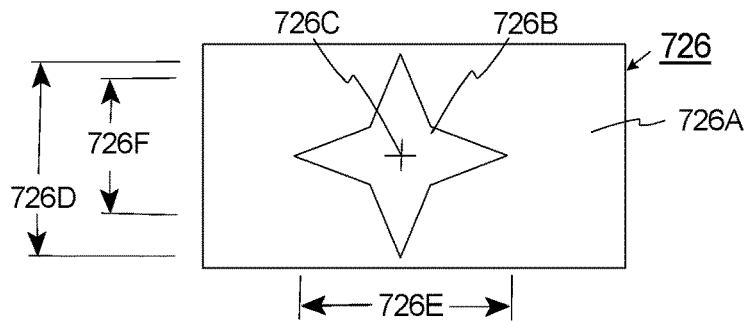
FIG. 7A is a simplified top perspective view of still another embodiment of a pattern blind assembly for the EUV lithography system of FIG. 1A.

FIG. 7A is a simplified top view of yet another embodiment of a pattern blind assembly 726 that can be used in the EUV lithography system 10 of FIG. 1A. In this embodiment, the pattern blind assembly 726 has a rigid blind body 726A (rectangular shaped in this example) that defines a four sided (isotoxal) star polygon shaped blind opening 726B centered on a blind axis 726C. With this design, the pattern blind assembly 726 can be positioned along the beam path 55 (illustrated in FIG. 1A) with the blind axis 726C coaxial with the beam path 55, to create a four sided (isotoxal) star polygon shaped exposure field 728 (illustrated in FIG. 7B) imaged on the workpiece 22 (illustrated in FIG. 7B).

It should be noted that the blind opening 726B has (i) a Y axis blind width 726D that corresponds to and sets a Y axis field width 728A (illustrated in FIG. 7B) of the exposure field 728 along the Y axis, and (ii) an X axis blind width 726E that corresponds to and sets an X axis field width 728B (illustrated in FIG. 7B) of the exposure field 728 along the X axis. At any X axis location within the X axis blind width 726E, an intermediate Y axis blind width 726F is defined. In this embodiment, the intermediate Y axis blind width 726F decreases (tapers linearly) near the extreme ends (vertices) of X axis blind width 726E. In some embodiments, the edges of the blind opening 726B may be adjustable or slightly curved to provide compensation for variations in the irradiance of the EUV light across the exposure field 728.

Figure 7B:
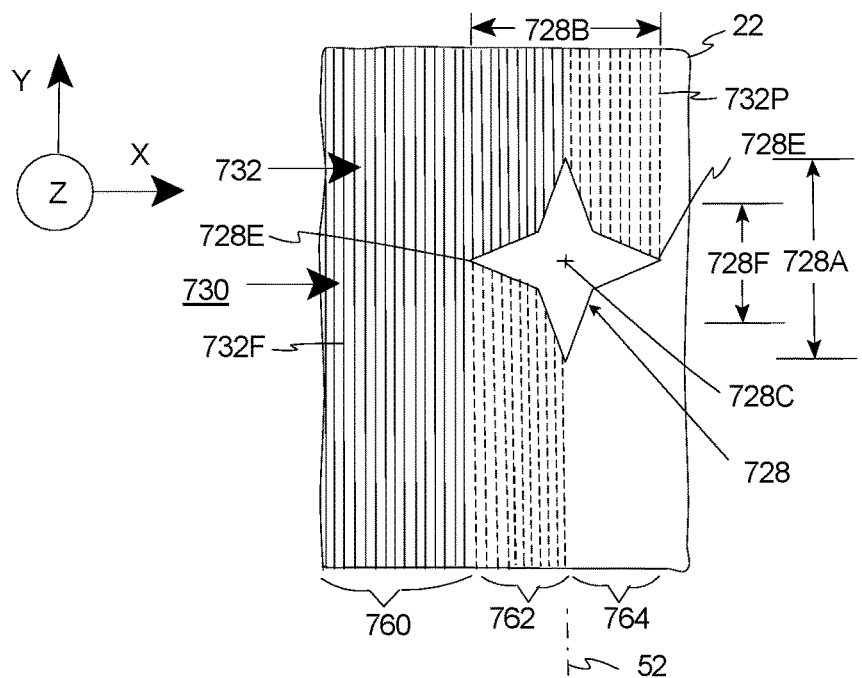
FIG. 7B is a simplified top view of a portion of the workpiece with an exposure field.

FIG. 7B is a simplified top view of a portion of a workpiece 22, including the pattern 730 of parallel lines 732 transferred onto a portion thereof. FIG. 7B also illustrates the exposure field 728 has a perimeter that is a four sided (isotoxal) star polygon shape, that is projected onto the workpiece 22 by the EUV lithography system 10 (illustrated in FIG. 1A). As provided herein, portions of the workpiece 22 are scanned (moved) along the scan axis 52 under the exposure field 728 at least two times to fully create each of the parallel lines 732.

In FIG. 7B, the partly created parallel lines 732P are illustrated with dashed lines and the fully created parallel lines 732F are illustrated with solid lines. In this example, the workpiece 22 is being moved upward along the scan axis 52 relative to the stationary exposure field 728.

As provided above, because of the shape of the blind opening 726B (illustrated in FIG. 7A), the exposure field 728 has (i) the Y axis field width 728A parallel to the scan axis 52 (Y axis); and (ii) the X axis field width 728B along the X axis (step direction). Additionally, the exposure field 728 has a field center 728C; and a pair of opposed distal X axis vertices 728E. Additionally, in this embodiment, an intermediate Y axis field width 728F that decreases (e.g. tapers linearly) as you get closer to the distal X axis vertices 728E. Thus, the dosage will decrease closer to the distal X vertices 728E of the exposure field 728. In FIG. 7B, the dose (and Y axis field width 728A) decreases from one hundred percent near the field center 728C to approximately zero percent near the distal X axis vertices 728E.

Further, in the simplified example of FIG. 7B, the exposure field 728 is illustrated to create portions of twenty parallel lines 732 during each pass. In the simplified example of FIG. 7B, the workpiece includes (i) the first set of lines 760 that are fully formed, (ii) the second set of lines 762 that are in the process of being fully formed, and (iii) the third set of lines 764 that are in the process of being partly formed.

Figure 7C:
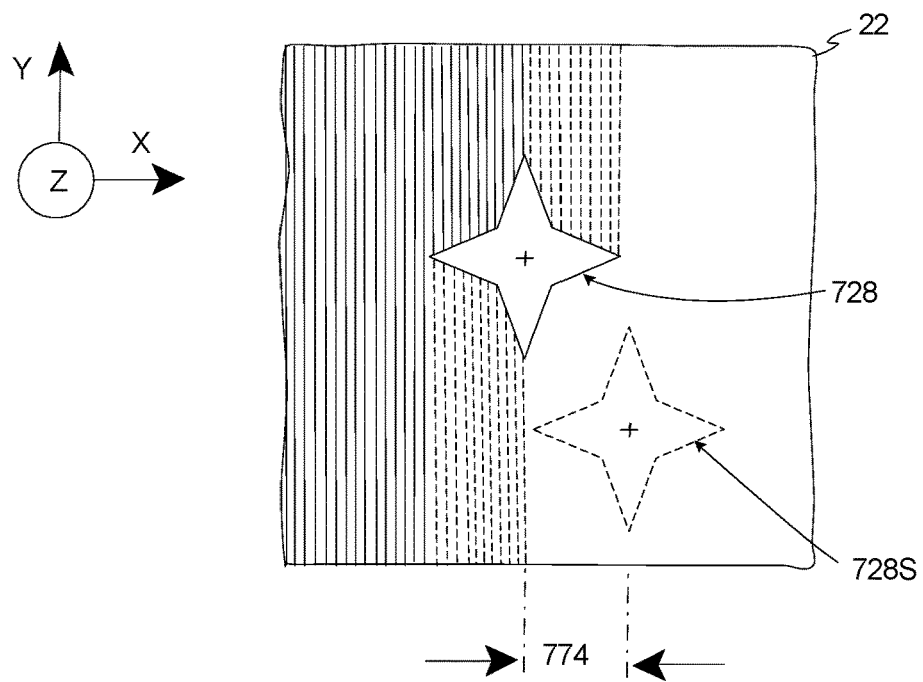
FIG. 7C is simplified top view of a portion of the workpiece with two exposure fields illustrated.

FIG. 7C is a simplified illustration of the workpiece 22 from FIG. 7B with a subsequent exposure field 728S illustrated with long dashes. The subsequent exposure field 728S is only illustrated in FIG. 7C to shown how the subsequent (in time) exposure field 728S will partly (approximately one-half in this example) overlap the exposure field 728 to allow for stitching of the adjacent exposures. Further, the exposure field 728, 728S are illustrated in different locations for ease of illustration. However, in practice, the exposure field 728, 728S remains at the same location while the workpiece 22 will have been moved.

As provided herein, the exposure field 728 is uniquely shaped, and positioned so that the illumination intensity of the exposure field 728 allows for the partial overlapping of two adjacent exposure fields 728, 728S to create a uniform exposure dose across the entire workpiece 22. When the second exposure is made, the total dose is delivered.

This allows for the stitching of exposures of adjacent, subsequent exposure fields 728 in the dense line EUV lithography system 10.

It should be noted that in this example, between each of the scanning processes, the workpiece 22 is stepped a step distance 774 of approximately fifty percent the maximum X axis field width 728B (illustrated in FIG. 7B) of the exposure field 722. This will result in an overlap of approximately fifty percent of the sequential exposures. In this design, each of the lines is fully formed after two passes under the exposure field 728.

Alternatively, a different step distance can be used and more than two passes with the exposure field 728 can be required to fully form each line in one or more of the embodiments provided herein. For example, with reference to FIG. 7D, the four sided (isotoxal) star polygon shaped exposure field 728 is again directed at the workpiece 22 by the EUV lithography system 10 (illustrated in FIG. 1A). The pattern blind assembly 726 of FIG. 7A can be used to define the exposure field 728 illustrated in FIG. 7D that has a Y axis field width 728A along the Y axis, and an X axis field width 728B along the X axis.

Figure 7D:
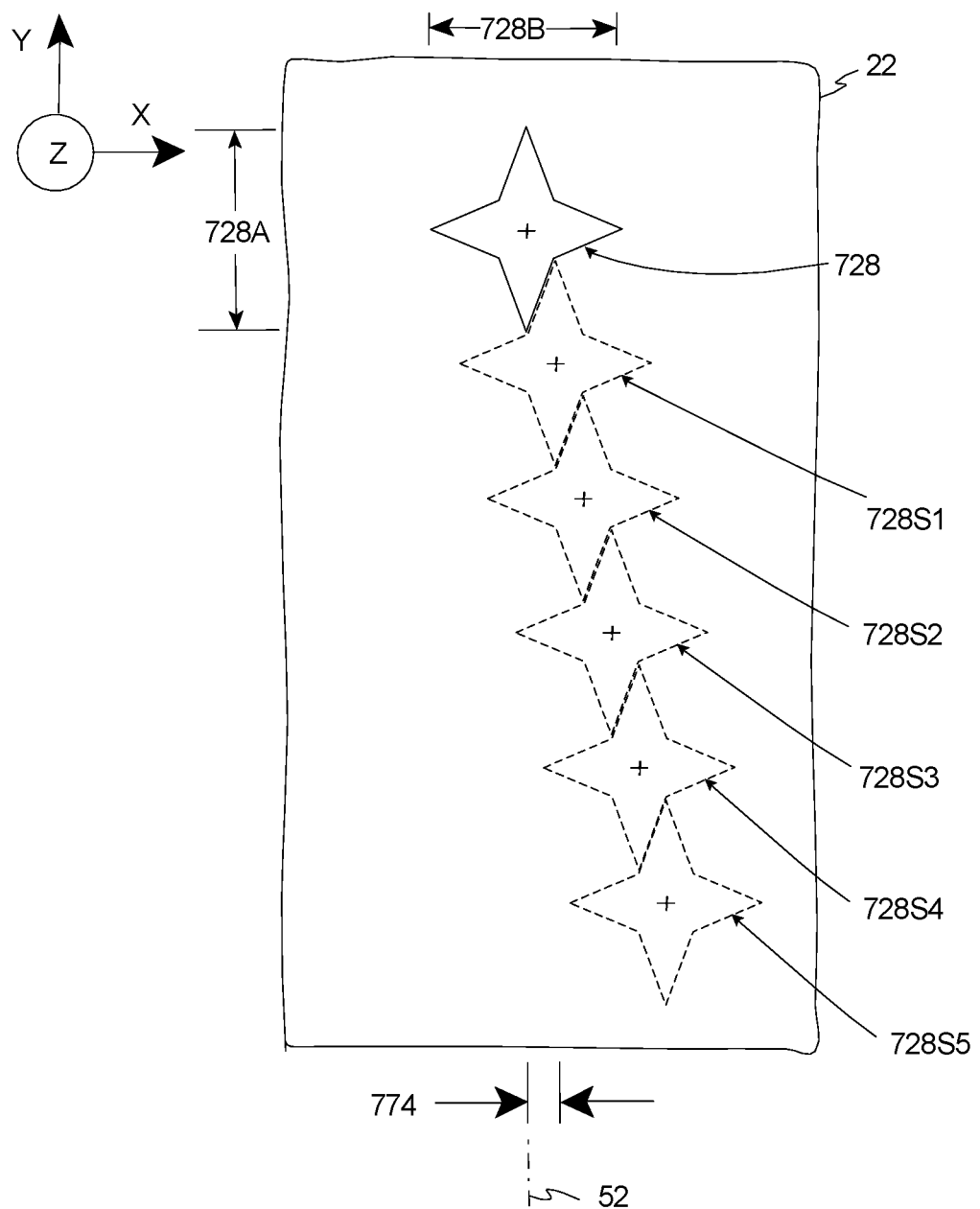
FIG. 7D is simplified top view of a portion of the workpiece with six exposure fields illustrated.

In FIG. 7D, five subsequent exposure fields 728S1, 728S2, 728S3, 728S4, 728S5 (Illustrated with dashed lines) are also illustrated to shown how these subsequent (in time) exposure fields 728S1, 728S2, 728S3, 728S4, 728S5 overlap the original exposure field 728 to stitch the adjacent exposures and fully form the parallel lines. More specifically, in FIG. 7D, (i) a first, subsequent (in time) exposure field 728S1 will partly (⅚ of the X axis field width 728B) overlap the original exposure field 728; (ii) a second, subsequent (in time) exposure field 728S2 will partly (⅔ of the X axis field width 728B) overlap the original exposure field 728; (iii) a third, subsequent (in time) exposure field 728S3 will partly (½ of the X axis field width 728B) overlap the original exposure field 728; (iv) a fourth, subsequent (in time) exposure field 728S4 will partly (⅓ of the X axis field width 728B) overlap the original exposure field 728; and (v) a fifth, subsequent (in time) exposure field 728S5 will partly (⅙ of the X axis field width 728B) overlap the original exposure field 728.

It should be noted that the exposure fields 728, 728S1, 728S2, 728S3, 728S4, 728S5 are illustrated in FIG. 7D in different locations for ease of illustration. However, in practice, the exposure field 728, 728S1, 728S2, 728S3, 728S4, 728S5 remains at the same location while the workpiece 22 will have been moved relative to the stationary exposure field. It should be noted that in this example, between each of the scanning processes, the workpiece 22 is stepped a step distance 774 of approximately ⅙th of the X axis field width 728B of the exposure field 722 for each subsequent pass. Thus, with this design, portions of the workpiece 22 are scanned (moved) along the scan axis 52 under the stationary exposure field 728 at least six times to fully create each of the parallel lines (not shown in FIG. 7D). Stated in another fashion, the exposure field 728 is uniquely shaped, and positioned so that the illumination intensity of the exposure field 728 allows for the partial overlapping of six adjacent exposure fields 728, 728S1, 728S2, 728S3, 728S4, 728S5 to create a uniform exposure dose across the entire workpiece 22. When the sixth exposure is made, the total dose is delivered. Stated in another fashion, in this example, it will take six passes of the exposure field 728 to complete the cycle and stitch of exposures of adjacent, subsequent exposure fields 728 in the dense line EUV lithography system 10. Because of the multiple passes, this design can be more tolerant to field-dependent aberrations.

As provided herein, providing efficient spatial overlap between immediately subsequent exposure fields 728, 728S1, 728S2, 728S3, 728S4, 728S5 create a uniformly-exposed area across the entire image workpiece 22. It is appreciated that, depending on a particular type/shape of the polygonal exposure field, more than two exposure passes may be required across the workpiece 22 surface to fully and completely expose it without leaving any non-exposed patches. In alternative, non-exclusive embodiments, depending upon the design of the exposure field, at least two, three, four, five, six, or more passes can be required to fully generate the parallel lines on the workpiece 22.

Figure 8A:
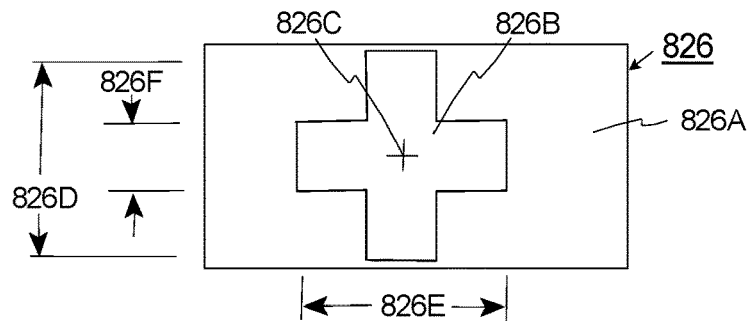
FIG. 8A is a simplified top perspective view of yet another embodiment of a pattern blind assembly for the EUV lithography system of FIG. 1A.

FIG. 8A is a simplified top view of yet another embodiment of a pattern blind assembly 826 that can be used in the EUV lithography system 10 of FIG. 1A. In this embodiment, the pattern blind assembly 826 has a rigid blind body 826A (rectangular shaped in this example) that defines a plus "+" shaped blind opening 826B centered on a blind axis 826C. With this design, the pattern blind assembly 826 can be positioned along the beam path 55 (illustrated in FIG. 1A) with the blind axis 826C coaxial with the beam path 55, to create a plus shaped exposure field 828 (illustrated in FIG. 8B) on the workpiece 22 (illustrated in FIG. 8B).

It should be noted that the blind opening 826B has (i) a Y axis blind width 826D that corresponds to and sets a Y axis field width 828A (illustrated in FIG. 8B) of the exposure field 828 along the Y axis, and (ii) an X axis blind width 826E that corresponds to and sets an X axis field width 828B (illustrated in FIG. 8B) of the exposure field 828 along the X axis. At any X axis location within the X axis blind width 826E, an intermediate Y axis blind width 826F is defined. In some embodiments, the edges of the blind opening 826B may be adjustable or slightly curved to provide compensation for variations in the irradiance of the EUV light across the exposure field 828.

Figure 8B:
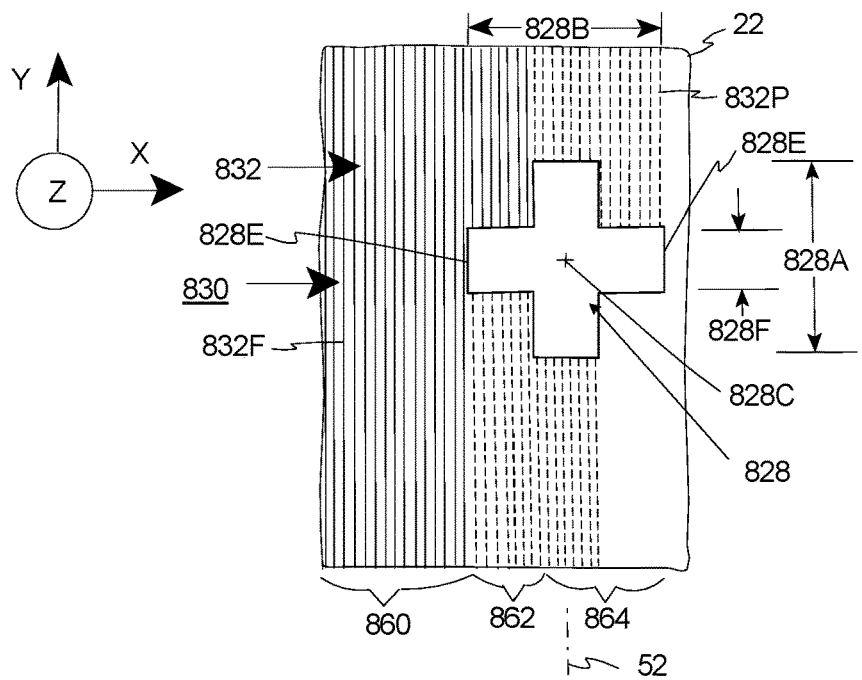
FIG. 8B is a simplified top view of a portion of the workpiece with an exposure field.

FIG. 8B is a simplified top view of a portion of a workpiece 22, including the pattern 830 of parallel lines 832 transferred onto a portion thereof. FIG. 8B also illustrates the exposure field 828 that is projected onto the workpiece 22 by the EUV lithography system 10 (illustrated in FIG. 1A). As provided herein, portions of the workpiece 22 are scanned (moved) along the scan axis 52 under the exposure field 828 at least two times to fully create each of the parallel lines 832.

In FIG. 8B, the partly created parallel lines 832P are illustrated with dashed lines and the fully created parallel lines 832F are illustrated with solid lines. In this example, the workpiece 22 is being moved upward along the scan axis 52 relative to the stationary exposure field 828.

As provided above, because of the shape of the blind opening 826B (illustrated in FIG. 8A), the exposure field 828 has (i) the Y axis field width 828A parallel to the scan axis 52 (Y axis); and (ii) the X axis field width 828B along the X axis (step direction). Additionally, the exposure field 828 has a field center 828C; and a pair of opposed distal X axis edges 828E. Additionally, in this embodiment, an intermediate Y axis field width 828F that is linear near the distal X axis edges 828E.

Further, in the simplified example of FIG. 8B, the exposure field 828 is sized to create portions of twenty one parallel lines 832 during each pass. In the simplified example of FIG. 8B, the workpiece includes (i) the first set of lines 860 that are fully formed, (ii) the second set of lines 862 that are in the process of being fully formed, and (iii) the third set of lines 864 that are in the process of being partly formed.

Figure 8C:
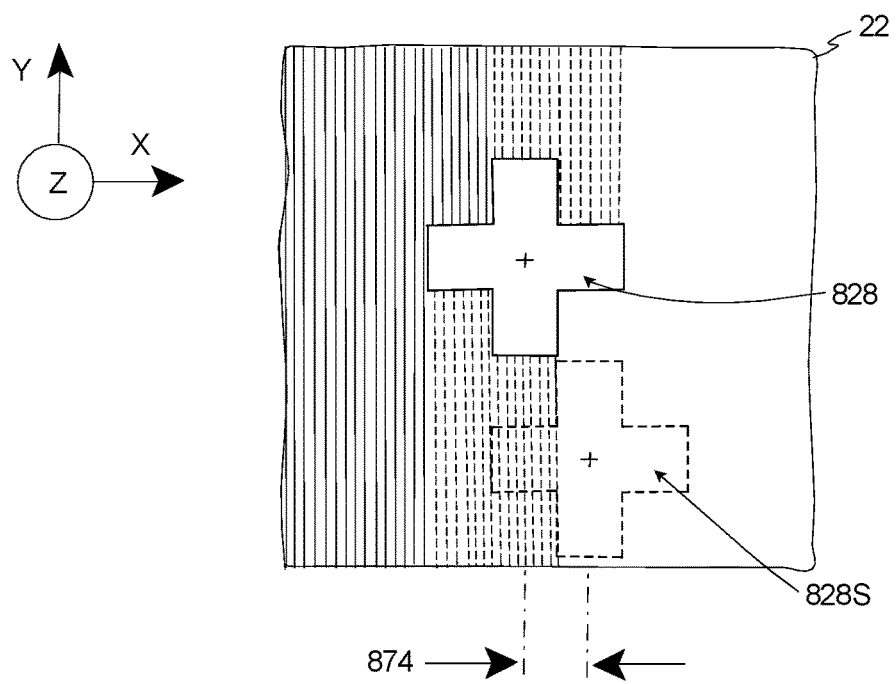
FIG. 8C is simplified top view of a portion of the workpiece with two exposure fields illustrated.

FIG. 8C is a simplified illustration of the workpiece 22 from FIG. 8B with a subsequent exposure field 828S illustrated with long dashes. The subsequent exposure field 828S is only illustrated in FIG. 8C to shown how the subsequent (in time) exposure field 828S will partly (approximately three-quarters in this example) overlap the exposure field 828 to allow for stitching of the adjacent exposures. Further, the exposure field 828, 828S are illustrated in different locations for ease of illustration. However, in practice, the exposure field 828, 828S remains at the same location while the workpiece 22 will have been moved.

As provided herein, the exposure field 828 is uniquely shaped, and positioned so that the illumination intensity of the exposure field 828 allows for the partial overlapping of two adjacent exposure fields 828, 828S to create a uniform exposure dose across the entire workpiece 22. When the second exposure is made, the total dose is delivered.

This allows for the stitching of exposures of adjacent, subsequent exposure fields 828 in the dense line EUV lithography system 10.

It should be noted that in this example, between each of the scanning processes, the workpiece 22 is stepped a step distance 874 of approximately twenty-five percent the maximum X axis field width 828B (illustrated in FIG. 8B) of the exposure field 822. This will result in an overlap of approximately seventy-five percent of the sequential exposures.

Figure 9:
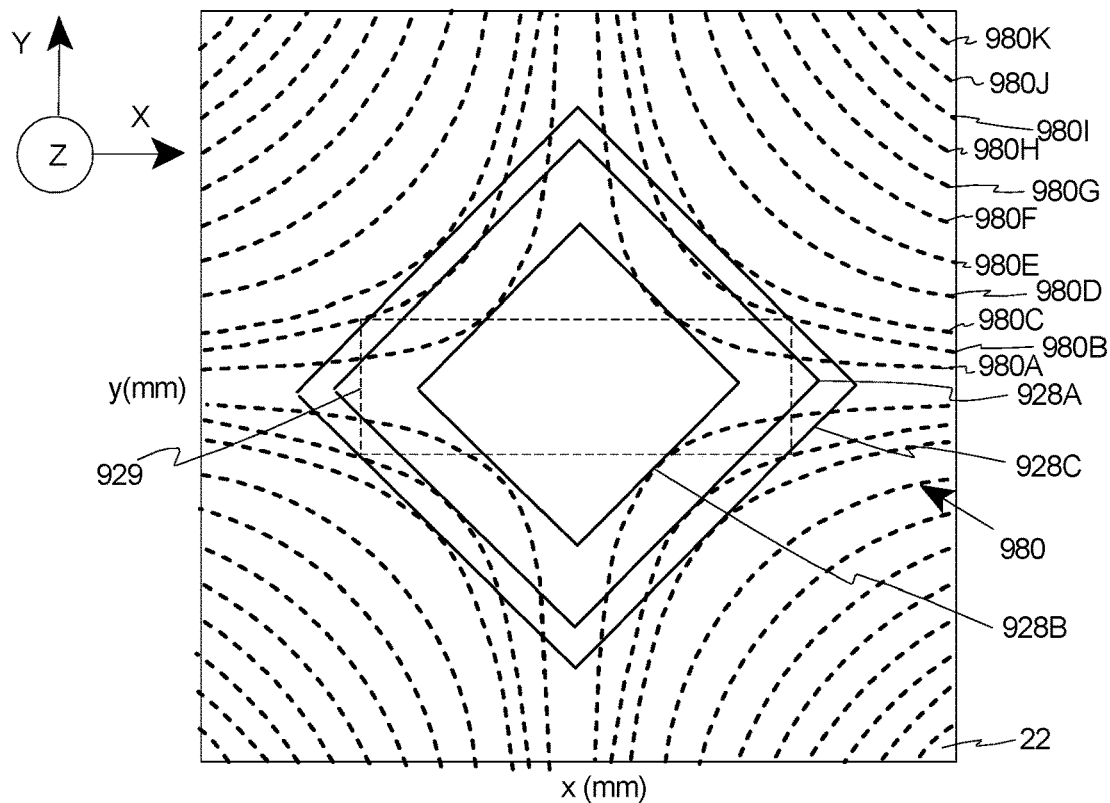
FIG. 9 is a simplified view of the field of view for a diamond shaped exposure field with a plurality of Z13 aberration contours.

FIG. 9 is a simplified view of three alternative, diamond shaped, exposure fields 928A, 928B, 928C projected onto a workpiece 22 (illustrated as a square) that was created using a pattern blind assembly similar to that illustrated in FIG. 3A. As provided herein, in certain embodiments, the problem of maximizing the optical throughput of the dense line, EUV lithography system 10 (illustrated in FIG. 1A) while maintaining good image quality is solved by defining (sizing and shaping) the exposure field 928 based on a maximum acceptable value of Z13 aberration while limiting the shape to ones that are compatible with stitching (such as a diamond shape illustrated in FIG. 9).

As provided herein, the power of the EUV lithography system 10 may be larger if the size of the EUV illumination source 34 (illustrated in FIG. 1A) is allowed to grow. Conventionally, the EUV illumination source 34 is optimized to have small etendue (product of area and solid angle). Since a typically incoherent, EUV illumination source 34 sends light into 4 pi steradians, the area of the EUV illumination source 34 is made to be small. However, if the rest of the EUV lithography system 10 can support a larger etendue, the amount of available power can grow.

In principle, the final etendue of the EUV lithography system 10 could be considered the total area of the exposure field 928 on the workpiece 22 (illustrated in FIG. 1A) times the solid angle used to illuminate it. The present embodiment provides a way to allow for a much larger etendue from the EUV illumination source 34. As provided herein, the dense line, EUV lithography system 10 can support a larger exposure field ("field of view"), and a larger etendue and the present embodiment describes optimal shapes of the field of view.

As provided herein, Z13 is secondary astigmatism (oriented at 45 deg) and tends to be the limiting aberration for the projection optical assembly 18 (illustrated in FIG. 1A). The amount of Z13 astigmatism will vary according to the design of the projection optical assembly 18. The amount of Z13 aberration varies across the field and is typically distributed as in FIG. 9 for the projection optical assembly 18 provided herein.

FIG. 9 illustrates a non-exclusive example of a plurality of Z13 aberration contours 980 (illustrated in dashed lines), including a first Z13 contour 980A; a second Z13 contour 980B; a third Z13 contour 980C; a fourth Z13 contour 980D; a fifth Z13 contour 980E; a sixth Z13 contour 980F; a seventh Z13 contour 980G; an eighth Z13 contour 980H; a ninth Z13 contour 980I; a tenth Z13 contour 980J; and an eleventh Z13 contour 980K. In this example, the magnitude of Z13 aberration increases from the first Z13 contour 980A to the eleventh Z13 contour 980L. As a non-exclusive example, (i) the first Z13 contour 980A can have a value of 0.01 waves/mm$^2$*x*y; (ii) a second Z13 contour 980B can have a value of 0.02 waves/mm$^2$*x*y; (iii) a third Z13 contour 980C can have a value of 0.03 waves/mm$^2$*x*y; (iv) a fourth Z13 contour 980D can have a value of 0.05 waves/mm$^2$*x*y; (v) a fifth Z13 contour 980E can have a value of 0.08 waves/mm$^2$*x*y; (vi) a sixth Z13 contour 980F can have a value of 0.1 waves/mm$^2$*x*y; (vii) a seventh Z13 contour 980G can have a value of 0.12 waves/mm$^2$*x*y; (viii) an eighth Z13 contour 980H can have a value of 0.15 waves/mm$^2$*x*y; (ix) a ninth Z13 contour 980I can have a value of 0.17 waves/mm$^2$*x*y; (x) a tenth Z13 contour 980J can have a value of 0.2 waves/mm$^2$*x*y; and (xi) an eleventh Z13 contour 980K can have a value of 0.24 waves/mm$^2$*x*y.

In this example, x and y axes in these plots are at the workpiece 22.

As provided herein, the designer would first choose a maximum allowable Z13 astigmatism that will achieve the desire image quality. Subsequently, the pattern blind assembly will be designed to achieve the largest exposure field (to increase throughput) while keeping the Z13 astigmatism at acceptable levels to achieve the desired image quality. For example, if the designer decides that 0.02 waves/mm$^2$*x*y is an acceptable level of Z13 astigmatism, then the pattern blind assembly is designed to achieve the largest exposure field 928A within 0.02 waves/mm$^2$*x*y. As illustrated in FIG. 9, for example, the second Z13 contour 980B may have a value of 0.02 waves/mm$^2$*x*y, and the first exposure field 928A is sized and shaped by the pattern blind assembly to fit "snugly" with the second Z13 contour 980B. With this design, a large, first exposure field 928A is generated while Z13 astigmatism is maintain at acceptable levels within the first exposure field 928A.

Alternatively, for example, if the designer decides that 0.01 waves/mm$^2$*x*y is an acceptable level of Z13 astigmatism, then the pattern blind assembly can be designed to provide the largest second exposure field 928B that is within, for example, the first Z13 contour 980A. Similarly, if the designer decides that 0.03 waves/mm$^2$*x*y is an acceptable level of Z13 astigmatism, then the pattern blind assembly can be designed to provide a largest third exposure field 928C that is within, for example, the third Z13 contour 980C.

In certain embodiments, the pattern blind assembly shapes the extreme ultraviolet beam so that all of the exposure field has a Z13 astigmatism that is below a predetermined, maximum Z13 astigmatism specification. As alternative, non-exclusive examples, the predetermined, maximum Z13 astigmatism specification is 0.01, 0.02, 0.03, or 0.04 waves/mm$^2$*x*y.

As provided herein, in certain embodiments, the shape of the exposure field 928A, 928B, 928C is designed to be scan-stitchable (e.g. the field width (in the scan direction) approaches zero at the ends of the field (in the cross scan direction)).

FIG. 9 also includes a rectangular shaped exposure field 929 (illustrated with dashed lines). In this example, the rectangular shaped exposure field 929 and the first exposure field 928A have the same maximum Z13 astigmatism. However, the diamond shaped first exposure field 928A has nearly twice the total area of the rectangular shaped exposure field 929. Thus, the present embodiment provides a larger exposure field 928A while maintaining suitable levels of Z13 astigmatism.

As provided herein, the symmetry of the Z13 distribution drives the shape of the exposure field toward something with 8-fold symmetry, such as a regular diamond (AKA a square with corners at top, bottom, left, and right as illustrated in FIG. 9). The regular diamond shaped exposure field 928A used here is convenient because it is a simple shape (having only four sides), and is compatible with scan-stitching. For example, adjacent passes could overlap by one half the width of the FOV. Any multiple of ½ are also possible, such as ¼, ⅙, etcetera. The advantage of more than two passes, for increased uniformity, would have to be weighed against throughput. Further, the regular diamond shape is simple and nearly optimal in terms of area and minimum number of scans per point on the workpiece 22.

Other shapes are also compatible with the distribution of Z13 astigmatism while also being scan-stitchable.

Figure 10:
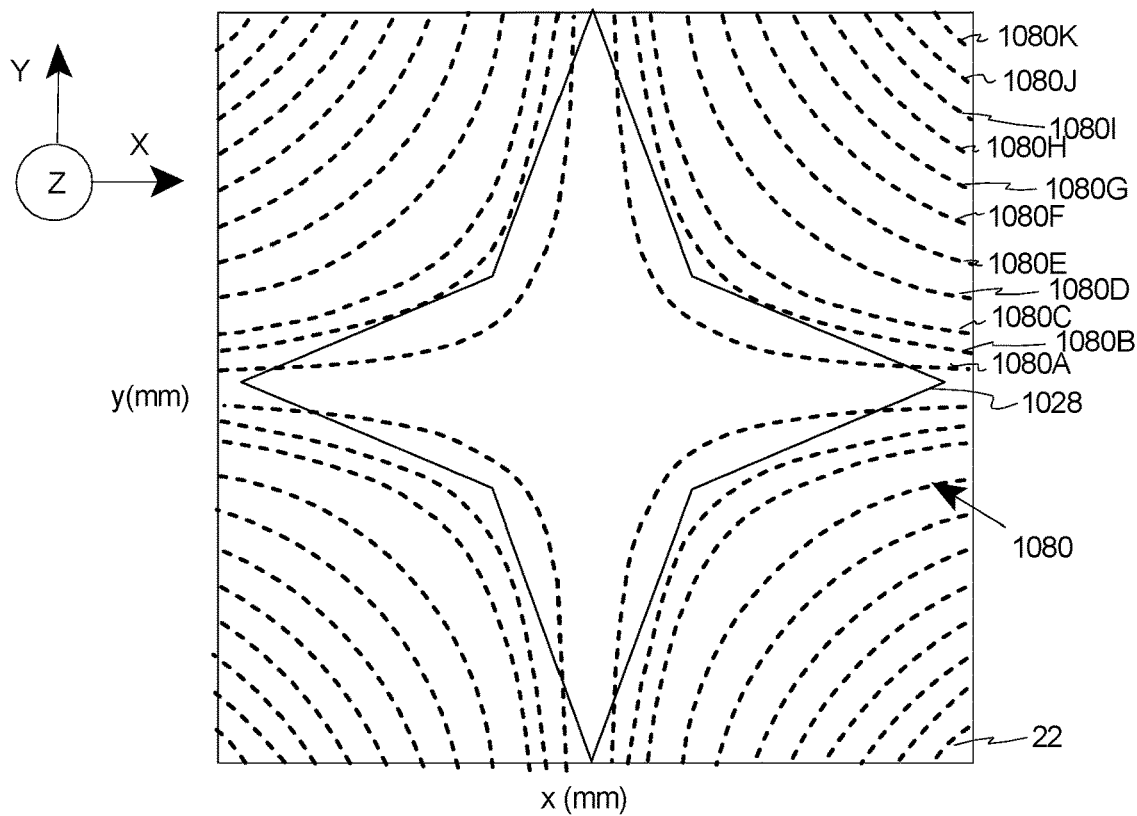
FIG. 10 is a simplified view of the field of view for a star shaped exposure field with a plurality of Z13 aberration contours.

FIG. 10 is a simplified view of a star shaped, exposure field 1028 projected onto a workpiece 22 (illustrated as a square) that was created using a pattern blind assembly similar to that illustrated in FIG. 7A. FIG. 10 also illustrates a non-exclusive example of a plurality of Z13 aberration contours 1080 (illustrated in dashed lines), including a first Z13 contour 1080A; a second Z13 contour 1080B; a third Z13 contour 1080C; a fourth Z13 contour 1080D; a fifth Z13 contour 1080E; a sixth Z13 contour 1080F; a seventh Z13 contour 1080G; an eighth Z13 contour 1080H; a ninth Z13 contour 1080I; a tenth Z13 contour 1080J; and an eleventh Z13 contour 1080K that are similar to the contours described above and illustrated in FIG. 9.

As provided above, the designer would first choose a maximum allowable Z13 astigmatism that will achieve the desire image quality. Subsequently, the pattern blind assembly will be designed to achieve the largest exposure field (to increase throughput) while keeping the Z13 astigmatism at acceptable levels to achieve the desired image quality. For example, if the designer decides that 0.02 waves/mm$^2$*x*y is an acceptable level of Z13 astigmatism, then the pattern blind assembly is designed to achieve the largest exposure field 1028 within 0.02 waves/mm$^2$*x*y. As illustrated in FIG. 10, the second Z13 contour 1080B has a value of 0.02 waves/mm$^2$*x*y, and the exposure field 1028 is sized and shaped by the pattern blind assembly to fit snugly with the second Z13 contour 1080B. With this design, a large, exposure field 1028 is generated while Z13 astigmatism is maintain at acceptable levels within the first exposure field 1028.

Figure 11:
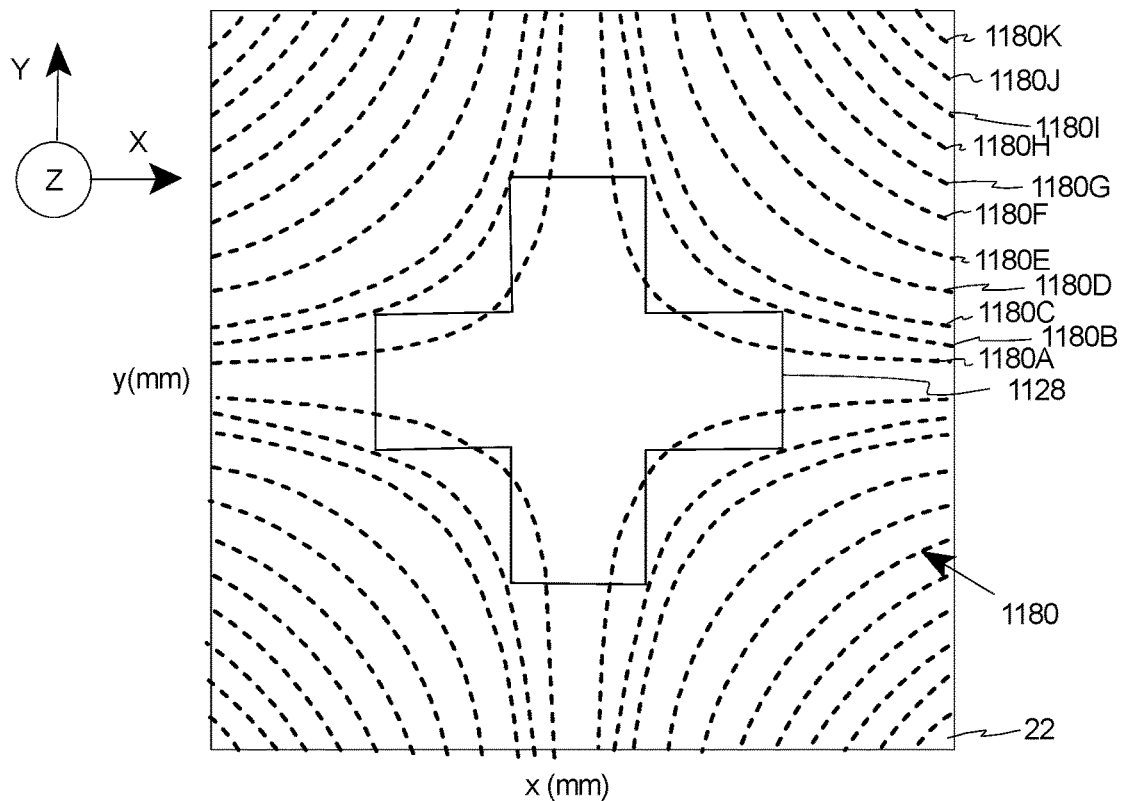
FIG. 11 is a simplified view of the field of view for a plus sign shaped exposure field with a plurality of Z13 aberration contours.

FIG. 11 is a simplified view of a red-cross (plus sign) shaped, exposure field 1128 projected onto a workpiece 22 (illustrated as a square) that was created using a pattern blind assembly similar to that illustrated in FIG. 8A. FIG. 11 also illustrates a non-exclusive example of a plurality of Z13 aberration contours 1180 (illustrated in dashed lines), including a first Z13 contour 1180A; a second Z13 contour 1180B; a third Z13 contour 1180C; a fourth Z13 contour 1180D; a fifth Z13 contour 1180E; a sixth Z13 contour 1180F; a seventh Z13 contour 1180G; an eighth Z13 contour 1180H; a ninth Z13 contour 1180I; a tenth Z13 contour 1180J; and an eleventh Z13 contour 1180K that are similar to the contours described above and illustrated in FIG. 9.

As provided above, the designer would first choose a maximum allowable Z13 astigmatism that will achieve the desire image quality. Subsequently, the pattern blind assembly will be designed to achieve the largest exposure field (to increase throughput) while keeping the Z13 astigmatism at acceptable levels to achieve the desired image quality. For example, if the designer decides that 0.02 waves/mm$^2$*x*y is an acceptable level of Z13 astigmatism, then the pattern blind assembly is designed to achieve the largest exposure field 1028 within 0.02 waves/mm²*x*y. As illustrated in FIG. 11, the second Z13 contour 1180B has a value of 0.02 waves/mm²*x*y, and the exposure field 1128 is sized and shaped by the pattern blind assembly to fit snugly with the second Z13 contour 1180B. With this design, a large, exposure field 1128 is generated while Z13 astigmatism is maintain at acceptable levels within the first exposure field 1128. This shape has slightly less area than the regular diamond, does not narrow down to zero width at the ends, and requires more than ½ overlap.

Figure 12A:
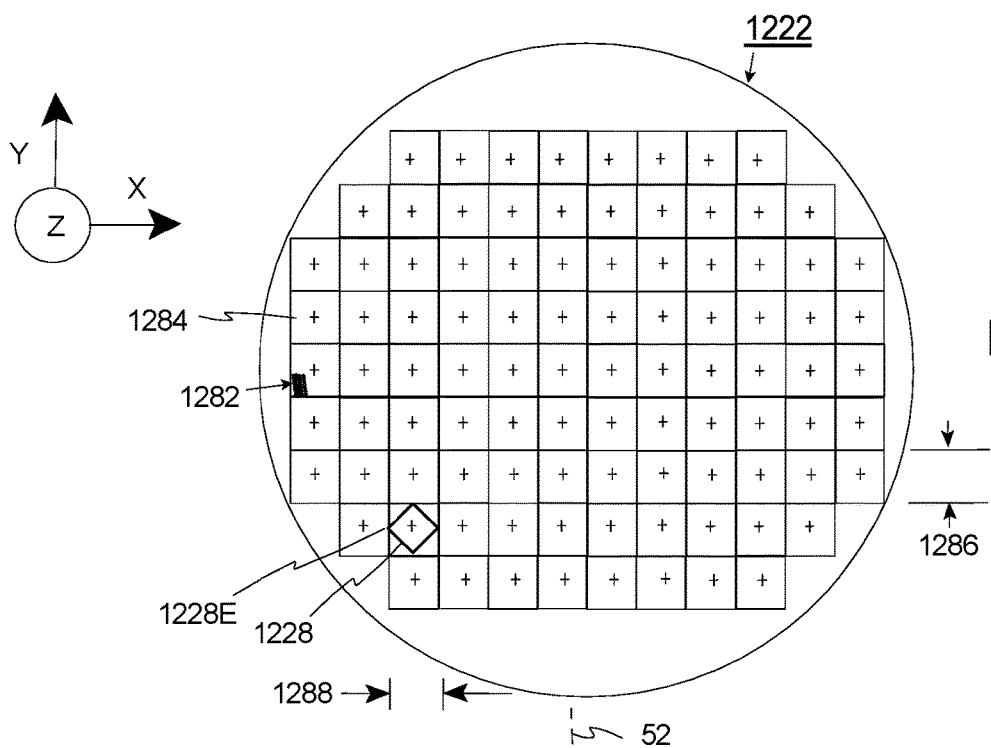
FIG. 12A is a simplified top view of a workpiece including a plurality of dies, and an exposure field having features of the present embodiment.

FIG. 12A is a simplified top view of a workpiece 1222 that has been processed with an exposure apparatus (not shown) to include an existing pattern 1282 (only a portion is illustrated as small circles) having a plurality of adjacent dies 1284 (also referred to as "exposure shots", "shots", or "chips") on the workpiece 1222. The design of the existing pattern 1282, and the number, size and shape of the dies 1284 can be varied. In the non-exclusive example illustrated in FIG. 12, the workpiece 1222 has been processed to include ninety-six rectangular shaped dies 1284. Further, for a three hundred millimeter diameter workpiece 1222, each of the dies 1284 can have a Y axis die width 1286 (along the Y axis) this is twenty-six millimeters, and an X axis die width 1288 (along the X axis) that is thirty-three millimeters. However, other numbers and other sizes are possible. A center of each die 1284 is identified with a plus sign. Each die 1284 can be created on the workpiece 1222 using a step and repeat lithography system (not shown) that exposes an area on the workpiece 1222 to create one of the dies and subsequently stepped to another area to create another die 1284. This process is repeated until the entire existing pattern 1282 is completed.

As provided herein, in certain embodiment, the present embodiment transfers the plurality of dense lines to the workpiece 1222 on top of the existing pattern 1282.

It should be noted that a first, non-exclusive example of an exposure field 1228 is also illustrated in FIG. 12A. In certain embodiments, the pattern blind assembly 326 (illustrated in FIG. 3A) is designed so that the resulting exposure field 1228 has an X axis field width 328B (illustrated in FIG. 3B) that is approximately equal to the X axis die width 1288 of the dies 1284. In alternative, non-exclusive examples, the pattern blind assembly 326 (illustrated in FIG. 3A) is designed so that the resulting exposure field 1228 has an X axis field width 328B (illustrated in FIG. 3B) that is within approximately 1, 2, 3, 4, 5, or 10 percent of the X axis die width 1288 of the dies 1284. With this design, the exposure field 1228 has an X axis field width 328B that can be aligned with the X axis die width 1288 of the dies 1284 during the scanning process. Stated in another fashion, the X axis field width 328B is chosen to conveniently align the edges of the exposure field 1228 to substantially align with features of a pre-existing pattern 1282 on the workpiece 22.

Figure 12B:
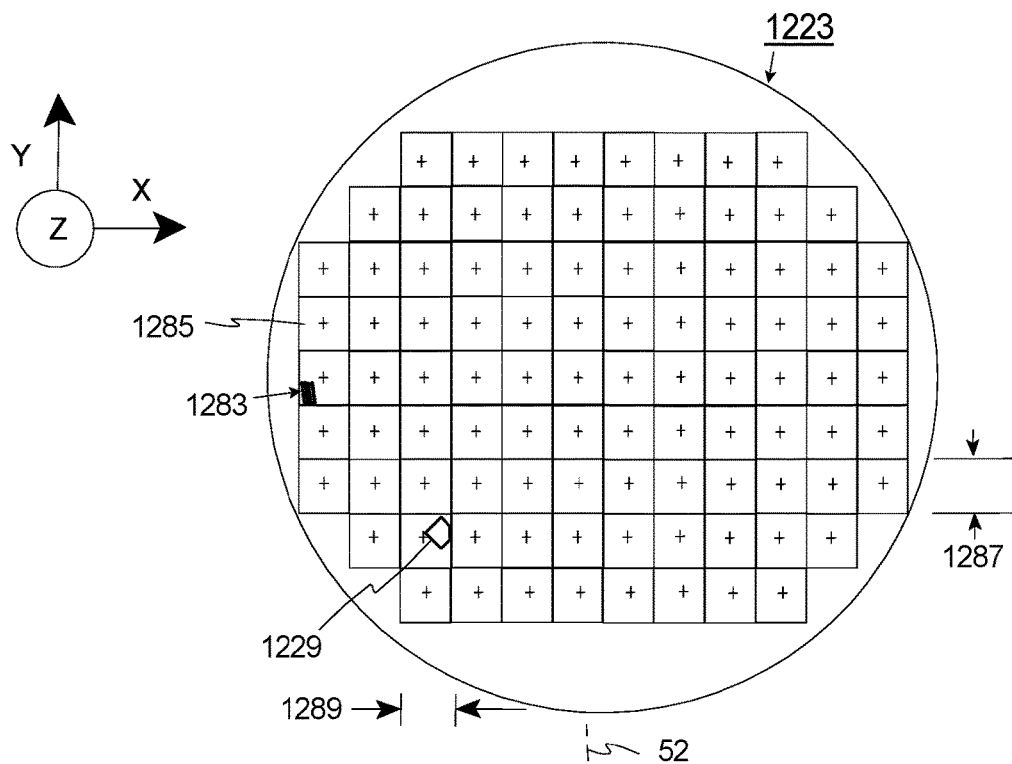
FIG. 12B is a simplified top view of a workpiece including a plurality of dies, and another exposure field having features of the present embodiment.

FIG. 12B is a simplified top view of another workpiece 1223 that has been processed with an exposure apparatus (not shown) to include an existing pattern 1283 having a plurality of adjacent dies 1285 that is similar to the embodiment described above in reference to FIG. 12A. Similarly, each die 1285 has a Y axis die width 1287 (along the Y axis) and an X axis die width 1289 (along the X axis). As provided herein, in certain embodiment, the present embodiment transfers the plurality of dense lines to the workpiece 1223 on top of the existing pattern 1283.

It should be noted that another, non-exclusive example of an exposure field 1229 is also illustrated in FIG. 12B. In certain embodiments, the pattern blind assembly 326 (illustrated in FIG. 3A) is designed so that the resulting exposure field 1229 has an X axis field width 328B (illustrated in FIG. 3B) that is less than the X axis die width 1289 of the dies 1285.

Additionally, with reference to FIGS. 1B and 12B, in certain embodiments, the movable shutter 27A can be controlled and moved to shape the EUV beam 13B so that at least one tapered portion of the exposure field 1229 is occluded and the corresponding edge of the exposure field 1229 is substantially parallel to the scan axis 52. With this design, the distal X axis edge formed by the occlusion of the exposure field 1229 can be adjusted to substantially align one side of the exposure field 1229 with the corresponding edge of dies 1285 on the workpiece 1223. In FIG. 12B, the movable shutter 27A is controlled so that the right edge of the exposure field is cut-off so that the exposure field 1229 aligns with the right edge of the die 1285. Alternatively, for example, the movable shutter 27A can be controlled so that the left edge of the exposure field is cut-off so that the exposure field 1229 aligns with the left edge of the die 1285.

Figure 13:
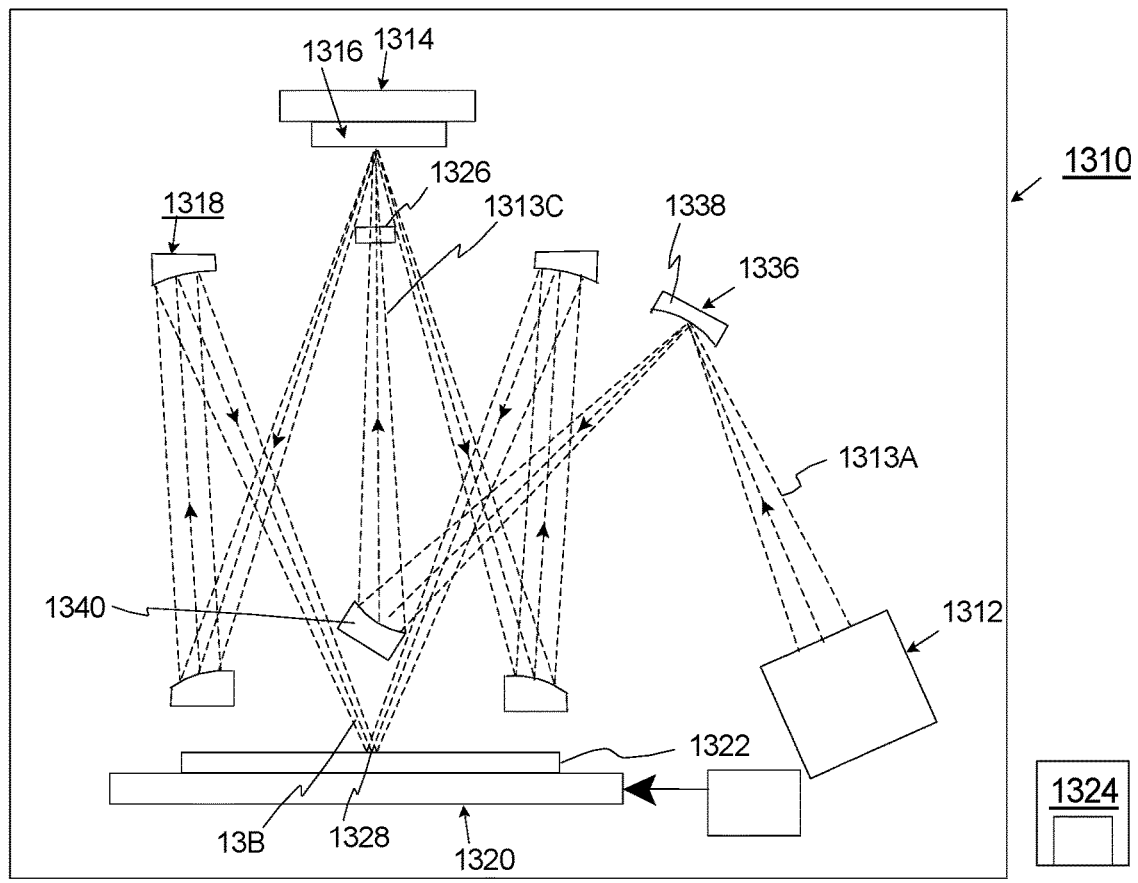
FIG. 13 is a simplified, schematic view illustrating another embodiment of the extreme ultraviolet lithography system.

FIG. 13 is a simplified, schematic view illustrating another embodiment of an extreme ultraviolet (EUV) lithography system 1310 that includes an EUV illumination system 1312 (irradiation apparatus), a patterning element holder 1314 that retains a patterning element 1316, a projection optical assembly 1318, a workpiece stage assembly 1320 that retains and positions a semiconductor workpiece 1322, a control system 1324, and a pattern blind assembly 1326 that defines the shape of an exposure field 1328 on the workpiece 1322. In this embodiment, the design of each of these components is somewhat similar to that described above and illustrated in FIG. 1A. However, in this embodiment, the pattern blind assembly 1326 is alternatively positioned in the path of the conditioned EUV beam 1313C near the patterning element 1316. The illustration shows an exaggerated distance between pattern blind assembly 1326 and patterning element 1318 for clarity; in certain embodiments this distance would be as small as possible. As alternative, non-exclusive examples, the pattern blind assembly 1326 can be positioned within approximately 1, 10, 50, or 100 microns of the patterning element 1316.

Further, in FIG. 13, illumination optical assembly 1336 is slightly different than the corresponding assembly 36 described above and illustrated in FIG. 1A. More specifically, in FIG. 13, the illumination optical assembly 1336 does not include the third illumination optical element 42, and the first illumination optical element 1338 (first fly's eye type reflector) and the second illumination optical element 1340 (second fly's eye type reflector) have been repositioned to direct the conditioned EUV beam 1313C at the patterning element 16.

Figure 14:
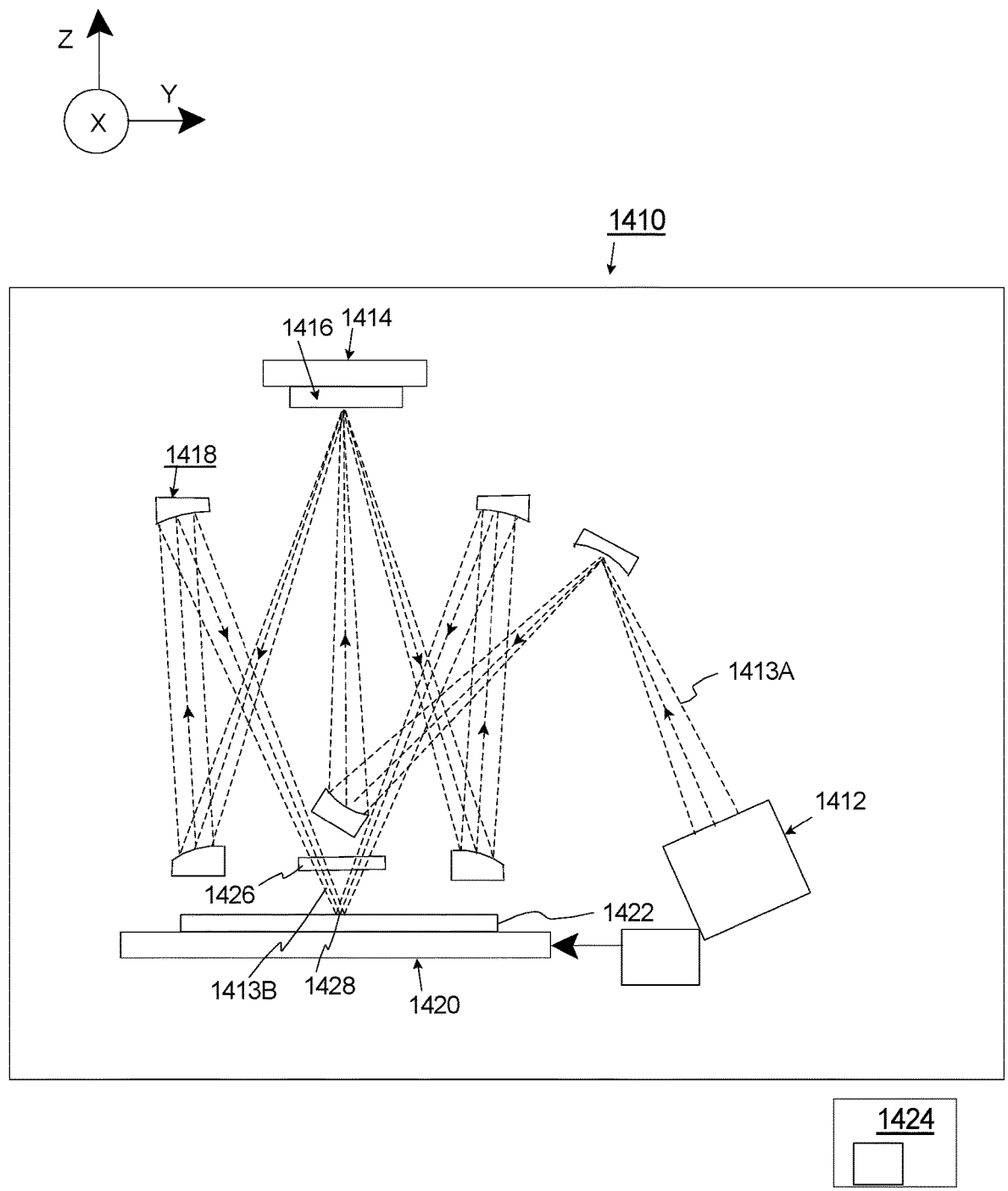
FIG. 14 is a simplified, schematic view illustrating yet another embodiment of the extreme ultraviolet lithography system.

FIG. 14 is a simplified, schematic view illustrating another embodiment of an extreme ultraviolet (EUV) lithography system 1410 that includes an EUV illumination system 1412 (irradiation apparatus), a patterning element holder 1414 that retains a patterning element 1416, a projection optical assembly 1418, a workpiece stage assembly 1420 that retains and positions a semiconductor workpiece 1422, a control system 1424, and a pattern blind assembly 1426 that defines the shape of an exposure field 1428 on the workpiece 1422. In this embodiment, the design of each of these components is similar to that described above and illustrated in FIG. 13. However, in this embodiment, the pattern blind assembly 1426 is alternatively positioned in the path of the diffracted EUV beam 1413B near the workpiece 1422. The illustration shows an exaggerated distance between pattern blind assembly 1426 and workpiece 1422 for clarity; in certain embodiments this distance would be as small as possible. As alternative, non-exclusive examples, the pattern blind assembly 1426 can be positioned within approximately 1, 10, 50, or 100 microns of the workpiece 722.

As described above, a photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 15A:
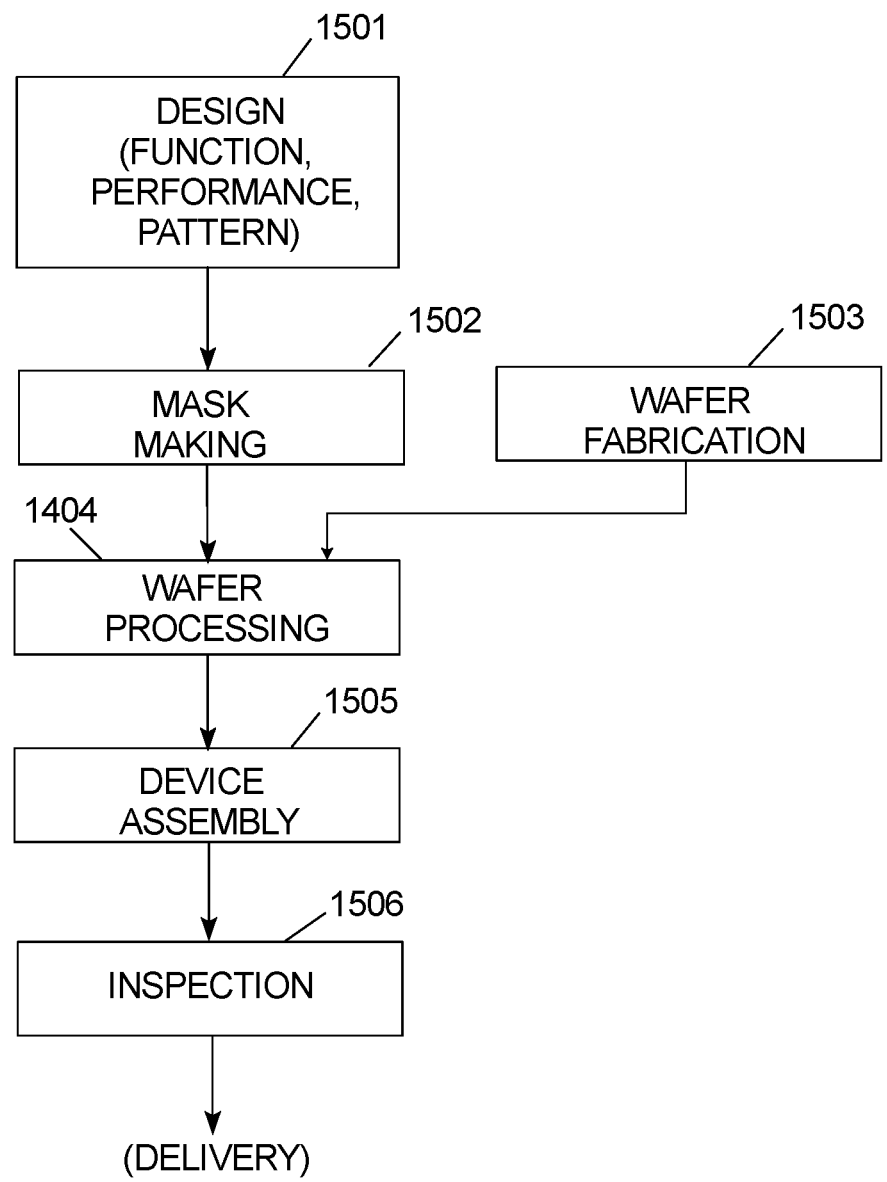
FIG. 15A is a flow chart that outlines a process for manufacturing a device in accordance with the present embodiment.

Further, semiconductor devices can be fabricated using the above described systems, by the process shown generally in FIG. 15A. In step 1501 the device's function and performance characteristics are designed. Next, in step 1502, a mask (reticle) having a pattern is designed according to the previous designing step, and in a parallel step 1503 a workpiece is made from a silicon material. The mask pattern designed in step 1502 is exposed onto the workpiece from step 1503 in step 1504 by a photolithography system described hereinabove in accordance with the present embodiment. In step 1505 the semiconductor device is assembled (including the dicing process, bonding process and packaging process), finally, the device is then inspected in step 1506.

Figure 15B:
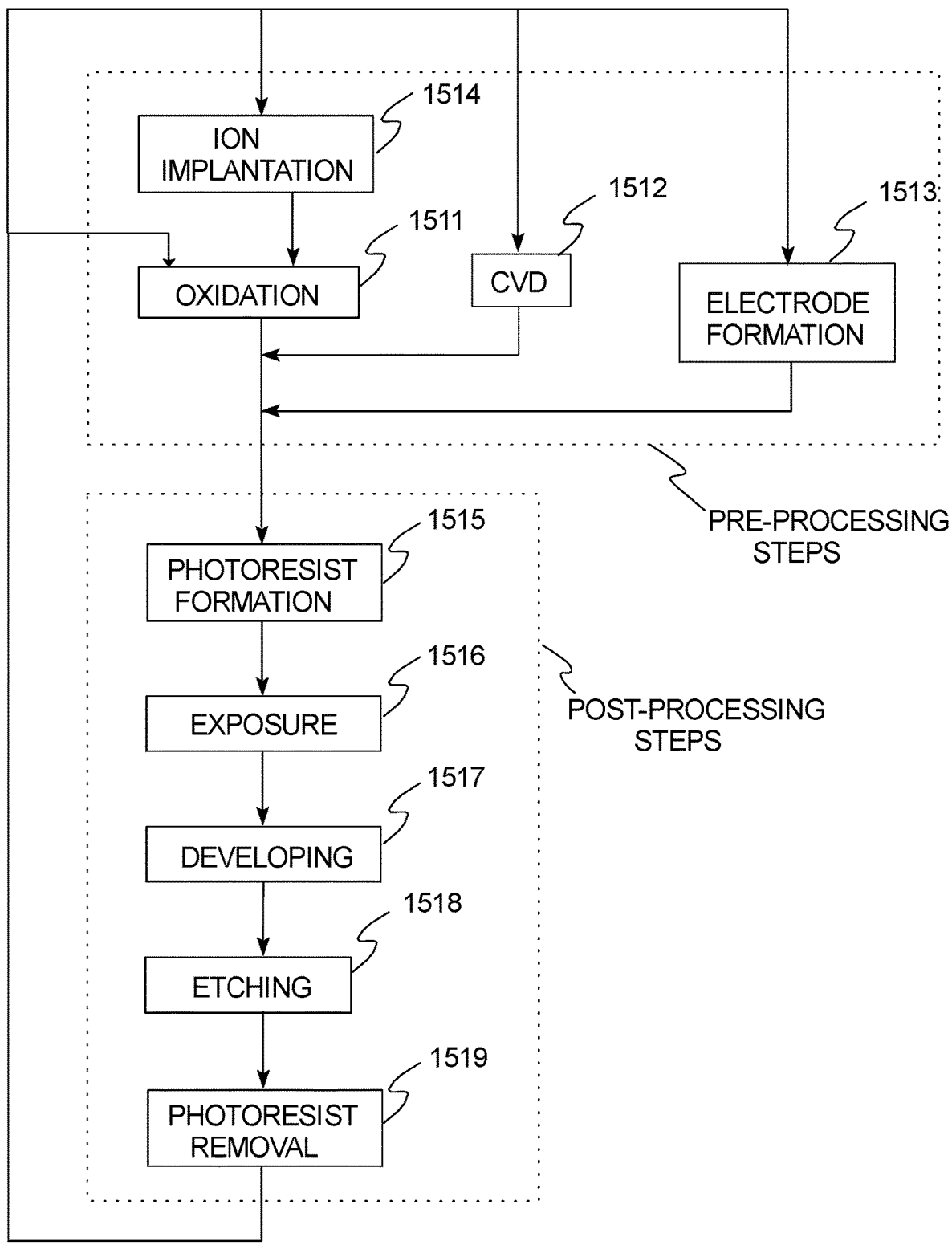
FIG. 15B is a flow chart that outlines device processing in more detail.

FIG. 15B illustrates a detailed flowchart example of the above-mentioned step 1504 in the case of fabricating semiconductor devices. In FIG. 15B, in step 1511 (oxidation step), the workpiece surface is oxidized. In step 1512 (CVD step), an insulation film is formed on the workpiece surface. In step 1513 (electrode formation step), electrodes are formed on the workpiece by vapor deposition. In step 1514 (ion implantation step), ions are implanted in the workpiece. The above mentioned steps 1511-1514 form the preprocessing steps for workpieces during workpiece processing, and selection is made at each step according to processing requirements.

At each stage of workpiece processing, when the above-mentioned preprocessing steps have been completed, the following post-processing steps are implemented. During post-processing, first, in step 1515 (photoresist formation step), photoresist is applied to a workpiece. Next, in step 1516 (exposure step), the above-mentioned exposure device is used to transfer the circuit pattern of a mask (reticle) to a workpiece. Then in step 1517 (developing step), the exposed workpiece is developed, and in step 1518 (etching step), parts other than residual photoresist (exposed material surface) are removed by etching. In step 1519 (photoresist removal step), unnecessary photoresist remaining after etching is removed.

Multiple circuit patterns are formed by repetition of these preprocessing and post-processing steps.

While the assembly as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. An extreme ultraviolet lithography system that creates a pattern having a plurality of parallel lines on a workpiece, the lithography system comprising:
   an optical system which forms a radiation pattern having a plurality of parallel lines on the workpiece with an extreme ultraviolet beam from an irradiation apparatus; and
   a workpiece stage assembly which retains and moves the workpiece relative to the radiation pattern along a scan direction which crosses to a pitch direction of the plurality of parallel lines of the pattern,
   wherein the optical system includes a pattern blind assembly which creates a shaped exposure field where the radiation pattern is formed on the workpiece without moving the radiation pattern in the shaped exposure field substantially in the scan direction, and
   wherein the shaped exposure field includes a first side extending a first direction which crosses to the pitch direction and the scan direction, and a second side extending a second direction which crosses to the first direction, the pitch direction, and the scan direction.

2. The extreme ultraviolet lithography system of claim 1, wherein the pattern having the plurality of parallel lines within a first region on the work piece is formed by moving the workpiece along the scan direction and directing the extreme ultraviolet beam at the workpiece with the optical system,
   wherein the pattern having the plurality of parallel lines within a second region on the work piece is formed by moving the workpiece along a counter scan direction opposite to the scan direction and directing the extreme ultraviolet beam at the workpiece with the optical system, and
   wherein the first region and the second region are overlapped.

3. The extreme ultraviolet lithography system of claim 2, wherein a first area where the first side sweeps in the first region and a second area where the second side sweeps in the second region are overlapped.

4. The extreme ultraviolet lithography system of claim 3, wherein the workpiece stage assembly executes a first movement which moves the workpiece along the scan direction, a second movement which moves the workpiece along the pitch direction, and a third movement which moves the workpiece along the counter scan direction.

5. The extreme ultraviolet lithography system of claim 4, wherein a length of a movement step of the workpiece during the second movement is determined so as to overlap the first area where the first side sweeps in the first region and the second area where the second side sweeps in the second region.

6. The extreme ultraviolet lithography system of claim 5, wherein the length of the movement step of the workpiece during the second movement is smaller than a length of a movement of the workpiece during the first or the third movement.

7. The extreme ultraviolet lithography system of claim 1, wherein the optical system includes:
- an illumination optical system which illuminates a patterning element with the extreme ultraviolet beam from the irradiation apparatus; and
- a projection optical system which projects diffraction beams created from illumination of the patterning element onto the workpiece.

8. The extreme ultraviolet lithography system of claim 7, wherein the pattern blind assembly is disposed along a beam path of the extreme ultraviolet beam between the irradiation apparatus and the patterning element.

9. The extreme ultraviolet lithography system of claim 8, wherein the pattern blind assembly shapes an illumination area on the patterning element.

10. The extreme ultraviolet lithography system of claim 9, wherein the pattern blind assembly is disposed in an optically conjugate position of the patterning element.

11. The extreme ultraviolet lithography system of claim 9, wherein the pattern blind assembly is disposed between the patterning element and an optical element of the illumination optical system nearest the patterning element.

12. The extreme ultraviolet lithography system of claim 7, wherein the pattern blind assembly is disposed along a beam path of the extreme ultraviolet beam between the patterning element and the workpiece.

13. The extreme ultraviolet lithography system of claim 12, wherein the pattern blind assembly is disposed between the workpiece and an optical element of the projection optical system nearest the workpiece.

14. The extreme ultraviolet lithography system of claim 7, wherein the illumination optical system directs the extreme ultraviolet beam along a beam path between beam paths where the diffraction beams from the patterning element propagate.

15. The extreme ultraviolet lithography system of claim 1, wherein the shaped exposure field on the workpiece which is shaped by the pattern blind assembly is trapezoidal shaped, and wherein the first and second sides are oblique sides of the trapezoid.

16. The extreme ultraviolet lithography system of claim 1, wherein the shaped exposure field on the workpiece which is shaped by the pattern blind assembly is diamond shaped, and wherein the first and second sides are oblique sides of the diamond.

17. The extreme ultraviolet lithography system of claim 1, wherein the shaped exposure field on the workpiece which is shaped by the pattern blind assembly is parallelogram shaped, and wherein the first and second sides are oblique sides of the parallelogram.

18. The extreme ultraviolet lithography system of claim 1, wherein the shaped exposure field on the workpiece which is shaped by the pattern blind assembly is hexagonal shaped, and wherein the first and second sides are oblique sides of the hexagon.

19. The extreme ultraviolet lithography system of claim 7, wherein the illumination optical system directs the extreme ultraviolet beam along a first beam path between second beam paths where the diffraction beams from the patterning element propagate, the first beam path being between the second beam paths in the pitch direction.

20. The extreme ultraviolet lithography system of claim 7, wherein the patterning element and the projection optical system remain stationary in the scan direction during movement of the workpiece stage assembly.

* * * * *